United States Patent [19]
Kobayashi et al.

[11] Patent Number: 5,949,230
[45] Date of Patent: Sep. 7, 1999

[54] NON-CONTACT VOLTAGE PROBE APPARATUS

[75] Inventors: Ryuichi Kobayashi, Fuchu; Mitsuo Hattori; Tsuyoshi Ideguchi, both of Tokyo, all of Japan

[73] Assignee: Nippon Telegraph and Telephone Corporation, Tokyo, Japan

[21] Appl. No.: 08/627,280

[22] Filed: Apr. 4, 1996

[30] Foreign Application Priority Data

| Apr. 5, 1995 | [JP] | Japan | 7-080482 |
| Oct. 3, 1995 | [JP] | Japan | 7-256352 |
| Dec. 12, 1995 | [JP] | Japan | 7-323046 |

[51] Int. Cl.$^6$ ............................................. G01R 31/02
[52] U.S. Cl. ................................. 324/72.5; 324/544
[58] Field of Search ..................... 324/72.5, 515, 324/544, 750, 758, 754

[56] References Cited

U.S. PATENT DOCUMENTS

| 2,408,045 | 9/1946 | Cottrell | 324/72.5 |
| 4,052,665 | 10/1977 | Gruenwald | 324/72.5 |
| 4,387,336 | 6/1983 | Joy | 324/515 |
| 5,311,116 | 5/1994 | Rogers . | |
| 5,337,261 | 8/1994 | Rogers . | |

FOREIGN PATENT DOCUMENTS

| 2 125 297 | 11/1972 | Germany . |
| 3 145 255 | 5/1983 | Germany . |
| 58-77667 | 5/1983 | Japan . |
| 2-82166 | 3/1990 | Japan . |
| 2-079-957 | 1/1982 | United Kingdom . |
| 2-215-067 | 9/1989 | United Kingdom . |

OTHER PUBLICATIONS

G.F. Turnbull et al., "Voltmetre Alternatif A Machoires Sans Contact" Le Journal De L'Equipment Electrique, pp. 177 and 119, Nov. 1966.

Kwang–Ta Huang, "Transient Source Detector for a Three–Phase System," Navy Tech. Discl. Bulletin, v. 10, n. 1, Sep. 1984, pp. 21–25.

Andreas Schutte et al., "Comparison of Time and Frequency Domain Electromagnetic Susceptibility Testing," Record of the Int'l Symp. on Electromagnetic Compatibility (EMC), Aug. 22–26, 1994, pp. 64–67.

"Study for no–contact measurement method of common-–mode interference voltage" Fukuoka Institute of Technology Mar. 27–30, 1995, Kobayashi et al., p. 294.

"Transmission route searching method for conducted interference" Chuo Unversity, Sep. 5–8, 1995 Kobayashi et al., p.173.

"Transmission Route Searching Method for Conducted Interference by Measuring its Energy" EMCJ95–69–75 Dec. 15, 1995, IECE Tech. Report, Kobayashi et al pp. 7–13.

"Fundamental study for transmission route searching method of impulse conducted noises" Tokyo Institute of Tech., Mar. 28–31, 1996, Kobayashi et al., p. 319.

*Primary Examiner*—Christine K. Oda
*Attorney, Agent, or Firm*—Venable; Robert J. Frank; Michael A. Sartori

[57] ABSTRACT

A non-contact voltage probe is used to measure the voltage of electromagnetic interference developed in a cable or the like electrically connected to pieces of electronic equipment. The non-contact voltage probe has double coaxial cylindrical-type inner and outer electrodes through which a cable or the like is passed. The inner electrode is electrically connected to a voltage detector, which measures the voltage induced by the capacitance between the inner electrode and the cable passing there through, and the outer electrode is grounded.

6 Claims, 27 Drawing Sheets

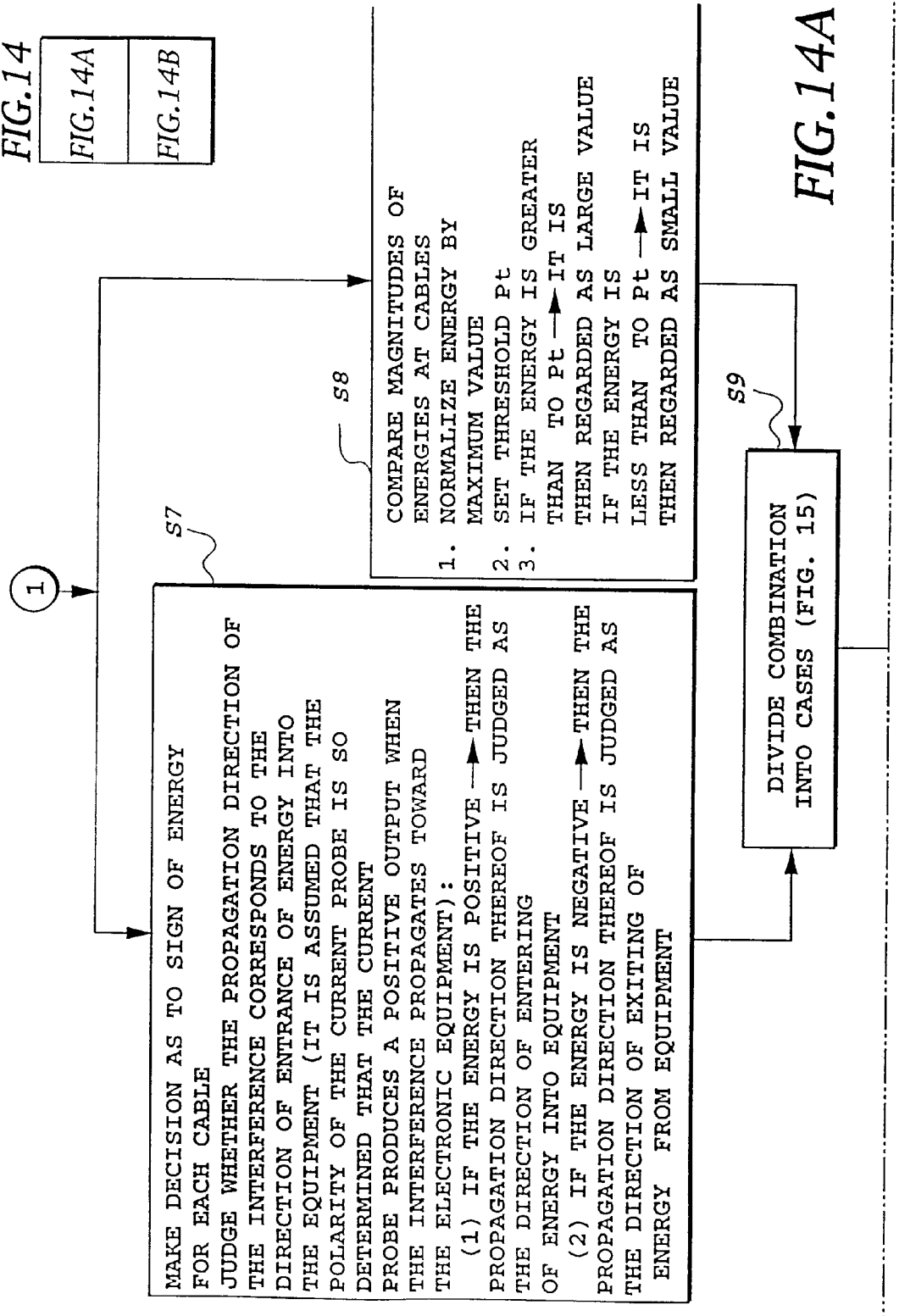

NON-CONTACT VOLTAGE PROBE APPARATUS

BACKGROUND OF THE INVENTION

1. Field of the Invention

The present invention relates to a non-contact voltage probe apparatus for searching for an electromagnetic disturbing source.

A method of specifying an electromagnetic interference invading route, which is proposed by the present invention, can be used to solve EMC (Electromagnetic Compatibility) problems that arise in electronic equipment, such as in telecommunication equipment, an information processing apparatus, etc. The utilization of the method according to the present invention makes it possible to specify the invading route with which the electromagnetic interference invades the equipment. As a result, effective countermeasures can be taken against the electromagnetic interference, and the electromagnetic interference source can be specified. Thus, the present method makes it useful to solve EMC problems. Further, because the determination of the interference invading route, which has heretofore depended on the experience and particular knowledge of the problem, can be objectively performed according to a physical quantity, even inexperienced users can easily determine the interference invading route.

2. Description of the Prior Art

With advances in semiconductor technology, information telecommunication equipment is now advancing in the areas of high density, high integration, and low-voltage driving. Further, the number of connecting cables for providing electrical connections between a plurality of pieces of equipment has increased, and the configuration of the connections between the equipment has become complicated. Therefore, a phenomenon has occurred in which common mode electromagnetic interference induced between the cable connected to the equipment and the earth or ground or the like propagates through the cables and invades the equipment, thereby causing failures in the equipment. With the advanced large scale system, in particular, the public is inconvenienced when the equipment produces this type of trouble, which also tends to occur with the advanced low-voltage driving. The electromagnetic interference that propagates through the cables or the like, is called "conducted interference." The prevention of the equipment failure due to the conducted interference has become a significant problem.

According to the "IEEE Standard Dictionary of Electrical and Electronics Terms," the term common mode interference is defined as "Interference that appears between both signal leads and a common reference plane (ground) and causes the potential of both sides of the propagation path to be changed simultaneously and by the same amount relative to the common reference plane (ground)." The term common mode voltage is the mean of the phasor voltages appearing respective conductors and a specified reference (usually, ground or earth). In contrast, the term differential mode interference is defined as "Interference that causes the potential of one side of the signal propagation path to be changed relative to the other side." The term differential mode voltage is the voltage between any two of a specified set of active conductors.

As part of the countermeasures to be taken against such conducted interference, an apparatus is required which measures the voltage and current of the interference entered therein and accurately recognizes an interference invading route and an interference level. By specifying an electromagnetic interference source as a cause of the equipment failure, an effective countermeasure can be taken, and the cause of the failure can be removed.

The measurement of the voltage and current of the interference under service and operational conditions is necessary to grasp the situation with regard to the malfunctions due to the interference.

It is therefore necessary to use a voltage probe capable of efficiently measuring conducted interference propagated through the cable, and, in particular, measuring a common mode voltage developed between the cable and the ground. Further, the voltage probe should measure the common mode voltage with ease, with satisfactory accuracy, and without the influence of the interference on communication signals under service conditions.

As one method of measuring the voltage, a non-contact voltage probe using capacitive coupling to the cable has been discussed. With capacitive coupling, however, the sensitivity of the probe could be unstable depending on the internal position of the cable and the capacitance between the cable and a surrounding metal body. In particular, the stray capacitance occurring between the cable and the surrounding metal body varies according to surrounding conditions. Therefore, the sensitivity of the probe greatly varies, and the probe is susceptible to the potential of the surrounding metal body.

FIG. 17A shows a conventional non-contact voltage probe apparatus. In the drawing, reference numerals 201A, 202, 203 and 204 respectively indicate a cylindrical electrode, a jig for fixing a cable 220, a high input impedance voltage probe, and a level meter. As shown in FIG. 17A, the cylindrical electrode 201A produces capacitive coupling between a metal body 230, such as a grounded metal cabinet 230, and a cable 221 or the like. In FIG. 17B, an equivalent circuit free of ambient influences is shown. A voltage Vp output from the probe 203 is given by the following equation (1):

$$V_p = j\omega C R_p / \{1 = j\omega R_p (C + C_p)\} \times V \qquad (1)$$

where V, C, $R_p$ and $C_p$ respectively indicate the voltage induced between the cable 220 and ground, the capacitance between the cable 220 and the cylindrical electrode 201A, the input resistance of a high input impedance voltage probe 203, and the input capacitance of the high input impedance voltage probe 203.

Now, assume that $C_q$ is the capacitance between the reinforcing bars for a building or a grounded metal cabinet 230 or the like and the cylindrical electrode 201A. Also, assume that a voltage $V_x$ exists in another cable 221 or the like, and that a capacitance $C_x$ couples the cable 221 and the cylindrical electrode 201A. In FIG. 17C, an equivalent circuit is shown. As can be seen from this equivalent circuit, the sensitivity of the probe varies according to the capacitances $C_x$ and $C_q$, and the influence of the voltage $V_x$ is included in a voltage $V_p'$. Thus, a large error is caused when measuring the voltage V.

The non-contact voltage probe apparatus of the prior art has the following problems in terms ok the above description, which result in an inability to accurately reproduce voltage measurements.

(1) According to the ambient conditions of the electrode 201A, the values $C_x$ and $C_q$ of the stray capacitances vary, and the sensitivity of the non-contact voltage probe apparatus varies.

(2) The non-contact voltage probe apparatus is susceptible to the voltage developed in the surrounding cable 221.

Moreover, measuring current using a current probe has previously been used to measure conducted interference propagating through a cable to invade equipment. However, the decision as to where the interference invades greatly depends on the engineer's experiences. It is therefore difficult to accurately specify an interference invading route. Even when resonances occurs, an attempt to specify the invading route by comparing the magnitudes of currents, for example, may be incorrect because the value of the current flowing into the position where the interference invades is not always maximum. For this reason, the invading route cannot be determined from the result of this comparison. Further, the determination of the direction of the current flow, other than d.c. current flow, also has difficulties, and the propagation direction of the electromagnetic interference cannot be specified in this manner either. Therefore, the decision as to the invading route depends on a measurer's experiences, and hence the invading route is often misjudged. As such, the invading route cannot be specified accurately, and thus it is difficult to determine the interference source causing the equipment failure.

Alternatively, a method for determining the interference invading route by connecting and disconnecting a cable connected to the equipment has also been proposed. Since, however, deactivation of the equipment and cutting or the like of the cable are necessary, the influence of interference under actual conditions cannot be judged with accuracy.

Further, when a plurality of interferences have invaded, searching for the interference source by connecting and disconnecting pieces of the cable likewise can not be achieved under actual conditions.

SUMMARY OF THE INVENTION

With the foregoing, it is therefore an object of the present invention to provide an improvement in the method for specifying an electromagnetic interference invading route to the equipment. This method has heretofore been executed either according to the engineer's experiences and knowledge or by connecting and disconnecting a cable. In other words, the present invention provides a method of and apparatus for accurately recognizing the behavior of electromagnetic interference and quantitatively specifying an invading route of the electromagnetic interference while the equipment is being kept in an operating state.

It is another object of the present invention to provide a method of and an apparatus for separating and searching for a plurality of interferences.

It is a further object of the present invention to provide a non-contact voltage probe apparatus operated stably, with excellent reproducibility, and for minimizing the influence of stray capacitances due to the circumstances surrounding the probe apparatus.

According to the first aspect of the present invention, there is provided a method of specifying invading routes of electromagnetic interference, comprising the steps of:
measuring voltages and currents of electromagnetic interference developed in a plurality of cables electrically connected to pieces of electronic equipment by voltage and current probes, respectively;
calculating an effective component of energy of the each electromagnetic interference from the result of measurements; and
specifying the invading route of the each electromagnetic interference from the direction in which the calculated energy flows.

Here, the invading route of each electromagnetic interference may be specified based on the magnitude of the energy calculated for the each cable and the direct on of flow of the energy.

For the case where the polarity of the current probe may be so determined that the current probe generates a positive output in response to the electromagnetic interference entering into the electronic equipment:
when the sign of the energy calculated for a given cable of the plurality of cables is positive, the electromagnetic interference is determined as being propagated through the cable in the direction in which the electromagnetic interference enters into the electronic equipment, and when the sign of the energy is negative, the electromagnetic interference is determined as being propagated through the cable in the direction in which the electromagnetic interference exits from the electronic equipment.

For the case where the polarity of the current probe may be so determined that the current probe generates a positive output in response to the electromagnetic interference exiting from the electronic equipment:
when the sign of the energy calculated for a given cable of the plurality of cables is positive, the electromagnetic interference is determined as being propagated through the cable in the direction in which the electromagnetic interference exits from the electronic equipment, and when the sign of the energy is negative, the electromagnetic interference is determined as being propagated through the cable in the direction in which the electromagnetic interference enters into the electronic equipment.

It may be determined that the electromagnetic interference invades a cable where the magnitude of the calculated energy is at maximum, and through which the calculated energy propagates toward the electronic equipment.

The voltage and current of each electromagnetic interference may be respectively measured by non-contact voltage and current probes so as to allow an electromagnetic interference invading route to be specified when the electronic equipment is in operation.

Waveforms of a voltage and a current of each electromagnetic interference may be measured in the time domain, and the energy of the interference may be calculated from the following computational expression, using the measured voltage waveform v(t) and current waveform i(t):

$$P_{\it{eff}} = \sum_i \{V(\omega_i) I^*(\omega_i) + V^*(\omega_i) I(\omega_i)\}$$

where $V(\omega_i)$, and $I(\omega_i)$ respectively indicate complex Fourier-transformed components capsulated from the measured waveforms of voltage v(t) and current i(t), and * indicates the complex conjugate thereof.

The absolute values of a voltage and a current of each electromagnetic interference and a chase difference between them may be measured, and the energy of the interference may be calculated from the following computational expression, using the measured voltage $V(\omega)$ and current $I(\omega)$:

$$P_{\it{eff}} = \sum_i \{V(\omega_i) I^*(\omega_i) + V^*(\omega_i) I(\omega_i)\}$$

where $V(\omega_i)$ and $I(\omega_i)$ respectively indicate voltage and current components of the measured frequency $\omega_i$ of electromagnetic interference, and * indicates the complex conjugate thereof.

The value of the energy of each electromagnetic interference may be determined by the following computational expression:

$$\int v(t)i(t)dt$$

The energy of each electromagnetic interference may be measured by a power measuring device.

When the sign of the calculated energy is positive, the energy flow may be determined as being propagated in the direction of polarity identical to the polarity of the current probe, and when the sign of the calculated energy is negative, the energy flow may be determined as being propagated in the direction of polarity opposite to the polarity of the current probe.

When the sign of the calculated energy is positive, the energy may be determined as being propagated in the direction identical to the polarity of the current probe, and when the sign of the energy is negative, the energy may be determined as being propagated in the direction of polarity opposite to the polarity of the current probe. A route extending in the direction of the entrance of the energy into the equipment, to which the energy propagates under the maximum magnitude of energy, is determined to be an invading route.

A route extending in the direction of entrance of the energy into the equipment, to which the energy propagates under the maximum magnitude of energy, may be determined to be an invading route.

According to the second aspect of the present invention, there is provided an apparatus for searching for an electromagnetic interference source, comprising:

a plurality of non-contact voltage probes respectively connected in non-contact with a plurality of cables connected to pieces of electronic equipment;

a plurality of non-contact current probes respectively connected in non-contact with the plurality of cables;

means for inputting therein a voltage and a current of the electromagnetic interference source both measured by voltage and current probes connected to the same cable of the plurality of cables and calculating an effective component of energy of each electromagnetic interference source; and means for specifying an invading route of each electromagnetic interference source from the direction in which the calculated energy flows.

The apparatus may further comprise:

means for specifying an invading route of the electromagnetic interference source from the magnitude of each calculated energy and the direction of flow thereof.

The specifying means may further include means for determining the electromagnetic interference source as being propagated through a given cable of the plurality of cables. For the case where the polarity of the current probe is so determined that the current probe generates a positive output in response to the electromagnetic interference entering into the electronic equipment:

when the sign of the energy calculated for a given cable of the plurality of cables is positive, the electromagnetic interference is determined as being propagated through the cable in the direction in which the electromagnetic interference enters into the electronic equipment, and when the sign of the energy is negative, the electromagnetic interference is determined as being propagated through the cable in the direction in which the electromagnetic interference exits from the electronic equipment.

For the case where the polarity of the current probe is so determined that the current probe generates a positive output in response to the electromagnetic interference exiting from the electronic equipment:

when the sign of the energy calculated for a given cable of the plurality of cables is positive, the electromagnetic interference is determined as being propagated through the cable in the direction in which the electromagnetic interference exits from the electronic equipment, and when the sign of the energy is negative, the electromagnetic interference is determined as being propagated through the cable in the direction in which the electromagnetic interference enters into the electronic equipment.

The apparatus may further comprise:

means for determining that the electromagnetic interference invades a cable where the magnitude of the calculated energy is at maximum, and through which the calculated energy propagates toward the electronic equipment.

Waveforms of a voltage and a current of each electromagnetic interference source may be measured in the time domain by the voltage and current probes connected to each cable, and the energy of the electromagnetic interference source may be calculated from the following computational expression, using the voltage waveform v(t) and current waveform i(t) measured by the calculating means:

$$P_{\mathit{eff}} = \sum_i \{V(\omega_i)I^*(\omega_i) + V^*(\omega_i)I(\omega_i)\}$$

where $V(\omega_i)$ and $I(\omega_i)$ respectively indicate complex Fourier-transformed components calculated from the measured waveforms of voltage v(t) and current i(t), and * indicates the complex conjugate thereof.

The apparatus may further comprise:

means for measuring waveforms V(t) and I(t) of a voltage and a current, respectively, of each electromagnetic interference source in the time domain by the voltage and current probes and converting the measured waveforms V(t) and I(t) from those in the time domain to those in the frequency domain by Fourier transformation thereby to obtain: a voltage $V(\omega_i)$ and a current $I(\omega_i)$; and wherein the energy of the electromagnetic interference source is calculated from the following computational expression using the voltage v(ω) and the current I(ω) by the calculating means:

$$P_{\mathit{eff}} = \sum_i \{V(\omega_i)I^*(\omega_i) + V^*(\omega_i)I(\omega_i)\}$$

where $V(\omega_i)$ and $I(\omega_i)$ respectively indicate voltage and current components of the frequency $\omega_i$ of electromagnetic interference source, and * indicates the complex conjugate thereof.

The apparatus may further comprise:

at least one means for measuring the absolute values of the voltage and current of each electromagnetic interference source in the frequency domain and a phase difference between the voltage and current, the measuring means including:

a non-contact voltage probe connected in non-contact with a cable connected to a piece of electronic equipment;

a non-contact current probe connected in non-contact with the cable; and means for inputting therein a voltage and a current of each electromagnetic interference source, both of which are measured by the voltage and current probes connected to the same cable of the plurality of cables;

means for calculating the energy of the electromagnetic interference source from the following computational expression based on the measured absolute values and phase difference:

$$P_{\textit{eff}} = \sum_i \{V(\omega_i)I^*(\omega_i) + V^*(\omega_i)I(\omega_i)\}$$

where $V(\omega_i)$ and $I(\omega_i)$ respectively indicate voltage and current components of the measured frequency $\omega_i$ of the electromagnetic interference source, and * indicates the complex conjugate thereof; and means for specifying an invading route of the electromagnetic interference source from the direction in which the calculated energy flows.

The energy of the electromagnetic interference source may be determined from the following computational expression by the calculating means based on the waveforms V(t) and I(t) of the voltage and current, respectively, of the electromagnetic interference source, both of which are measured in the time domain by the voltage and current probes:

$$\int v(t)i(t)dt$$

The apparatus may further comprise:

at least one power measuring device for measuring the energy of the electromagnetic interference source, the power measuring device including:

a non-contact voltage probe connected in non-contact with a cable connected to a piece of electronic equipment;

a non-contact current probe connected in non-contact with the cable; and means for inputting therein a voltage and a current of each electromagnetic interference source, both of which are measured by voltage and current probes connected to the same cable of the plurality of cables; and means for specifying an invading route of the electromagnetic interference source from the direction in which the calculated energy flows.

The apparatus may further comprise:

means for displaying the energy of the electromagnetic interference source calculated by the calculating means in the form of a frequency spectrum.

The specifying means may comprise means for determining the energy being propagated in the direction identical to the polarity of the current probe when the sign of the calculated energy is positive, determining the energy being propagated in the direction opposite to the polarity of the current probe when the sign of the energy is negative, and determining, as an invading route, a route extending in the direction of entrance of the energy into the equipment to which the energy propagates under the maximum magnitude of energy.

A route extending in the direction of entrance of the energy into the equipment to which the energy propagates under the maximum magnitude of energy may be determined to be an invading route.

According to the third aspect of the present invention, there is provided an apparatus for searching for an electromagnetic interference source, comprising:

means for measuring, in the time domain waveforms of a voltage and a current of the electromagnetic interference source developed in each of the cables connected to electronic equipment;

means for recording the measured waveforms of the voltage and current therein;

means for converting the measured waveforms of the voltage and current into waveforms of the voltage and current in the frequency domain respectively;

means for calculating energy for each frequency, based on the voltage and current waveforms in the frequency domain; and means for displaying the energy calculated for each frequency in the form of the positive and negative polarities of the energy and the magnitude thereof so as to correspond to coordinates indicative of each frequency.

The apparatus may further comprise:

means for determining the electromagnetic interference source as follows:

(1) for the case where the polarity of the current probe is so determined that the current probe generates a positive output in response to the electromagnetic interference entering into the electronic equipment:

when the sign of the energy calculated for a given cable of the plurality of cables at each frequency is positive, the electromagnetic interference is determined as being propagated through the cable in the direction in which the electromagnetic interference enters into the electronic equipment, and when the sign of the energy is negative, the electromagnetic interference is determined as being propagated through the cable in the direction in which the electromagnetic interference exits from the electronic equipment; and (2) for the case where the polarity of the current probe is so determined that the current probe generates a positive output in response to the electromagnetic interference exiting from the electronic equipment:

when the sign of the energy calculated for a given cable of the plurality of cables at each frequency is positive, the electromagnetic interference is determined as being propagated through the cable in the direction in which the electromagnetic interference exits from the electronic equipment, and when the sign of the energy is negative, the electromagnetic interference is determined as being propagated through the cable in the direction in which the electromagnetic interference enters into the electronic equipment.

Here, the measuring means may have non-contact voltage and current probes.

The waveforms of the voltage and current of the electromagnetic interference source may be measured in the time domain by the voltage and current probes, and the energy of the electromagnetic interference source may be calculated from the following computational expression, using the voltage waveform v(t) and current waveform i(t) measured by the calculating means:

$$P_{\textit{eff}} = \sum_i \{V(\omega_i)I^*(\omega_i) + V^*(\omega_i)I(\omega_i)\}$$

where $v(\omega_i)$ and $I(\omega_i)$ respectively indicate complex Fourier-transformed components calculated from the measured waveforms of voltage v(t) and current i(t), and * indicates the complex conjugate thereof.

The apparatus may further comprise:

means for measuring waveforms V(t) and I(t) of the voltage and current of the electromagnetic interference source in the time domain by the voltage and current probes and converting the measured waveforms V(t) and I(t) from data in the time domain to data in the frequency domain by Fourier transformation thereby to obtain a voltage $V(\omega_i)$ and a current $I(\omega_i)$; and wherein the energy of the electromagnetic interference source is calculated from the following computational expression using the voltage $V(\omega_i)$ and the current $I(\omega_i)$ by the calculating means:

$$P_{\it{eff}} = \sum_i \{V(\omega_i)I^*(\omega_i) + V^*(\omega_i)I(\omega_i)\}$$

where $v(\omega_i)$ and $I(\omega_i)$ respectively indicate voltage and current components of the measured frequency $\omega_i$ of electromagnetic interference source, and * indicates the complex conjugate thereof.

According to the fourth aspect of the present invention, there is provided a non-contact voltage probe apparatus comprising:

a cylindrical inner electrode;

a coaxial cylindrical outer electrode coaxially provided outside the cylindrical inner electrode so as to surround the cylindrical inner electrode;

a cable fixing member disposed inside the cylindrical inner electrode, for allowing a cable to be measured to penetrate therein and holding the cable therein;

voltage detecting means having a high input impedance, the voltage detecting means being electrically connected to the cylindrical inner electrode; and means for connecting the coaxial cylindrical outer electrode to ground of the voltage detecting means.

Here, plastic or a foamed material having low dielectric constant may be disposed between the cylindrical inner electrode and the coaxial cylindrical outer electrode.

The inner and outer electrodes and the cable fixing member may be made up of two half portions having semi-cylindrical shapes obtained by dividing an integral construction of the inner and outer electrodes and the cable fixing member into two, and the two half portions may be capable of being electrically and mechanically coupled to each other so as to allow the cable to be interposed inside the cable fixing member.

Portions of the two half portions, which constitute the cylindrical inner electrode, and portions of the two half portions, which constitute the coaxial cylindrical outer electrode, may be connected to one another by a repetitive flexion-resistant conductor.

The two half portions may be electrically and mechanically coupled to each other with hinges or electrical contacts.

The voltage detecting means may be a high input impedance voltage probe having active elements.

The present invention has been described in detail with respect to preferred embodiments, and changes and modifications may be made without departing from the invention in its broader aspects. It is the intention, therefore, that the appended claims cover all such changes and modifications as fall within the true spirit of the invention.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 14 is a diagram explaining the relationship between FIGS. 14A and 14B;

FIGS. 14A and 14B are respectively flowcharts for explaining an example of a procedure for calculating energy by a fifth embodiment of the present invention;

DETAILED DESCRIPTION OF THE PREFERRED EMBODIMENTS

Embodiments of the present invention will hereinafter be described in detail with reference to the accompanying drawings.

First Embodiment

Figure 1:
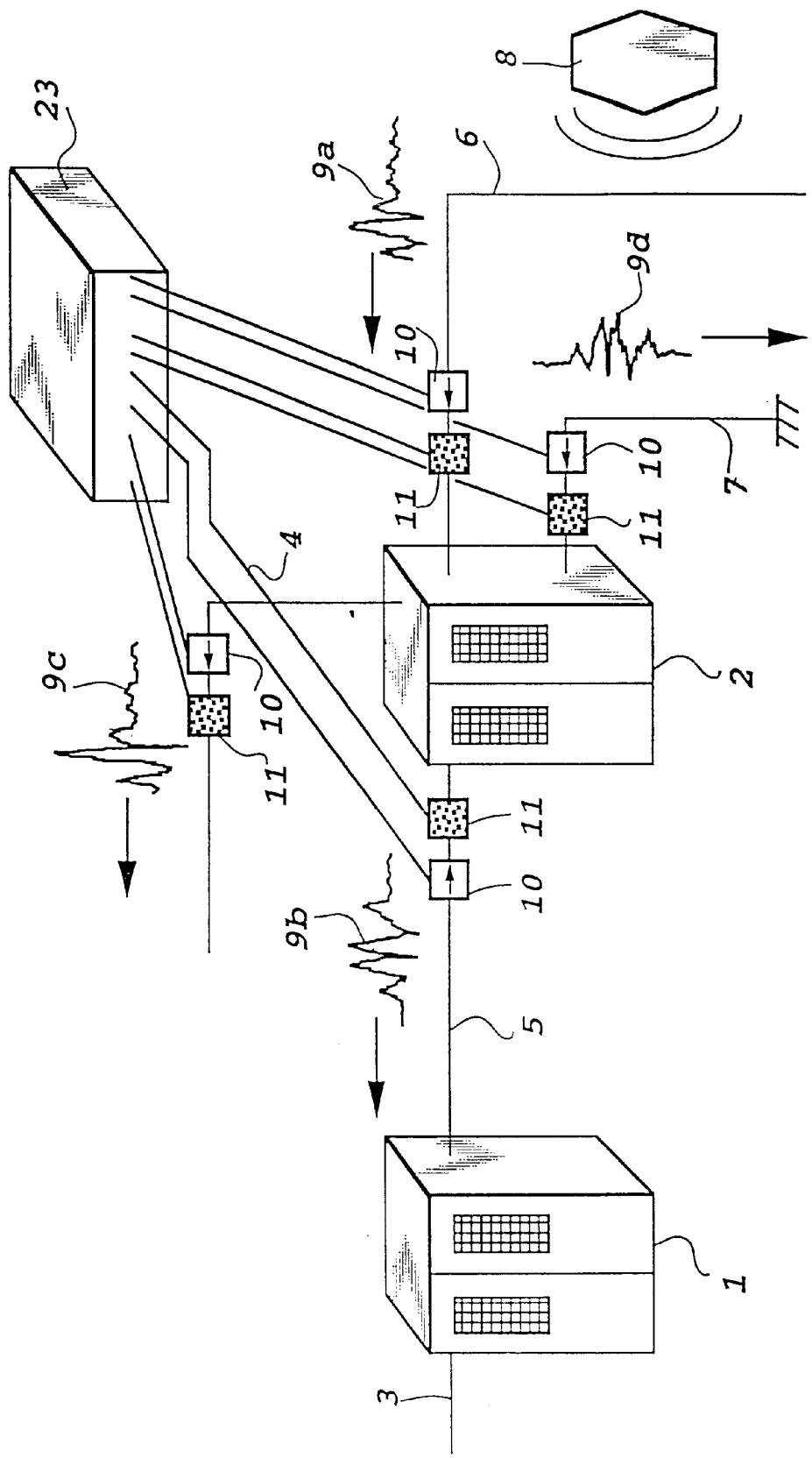
FIG. 1 is a configuration explanatory view showing a first embodiment of the present invention.
Figure 10:
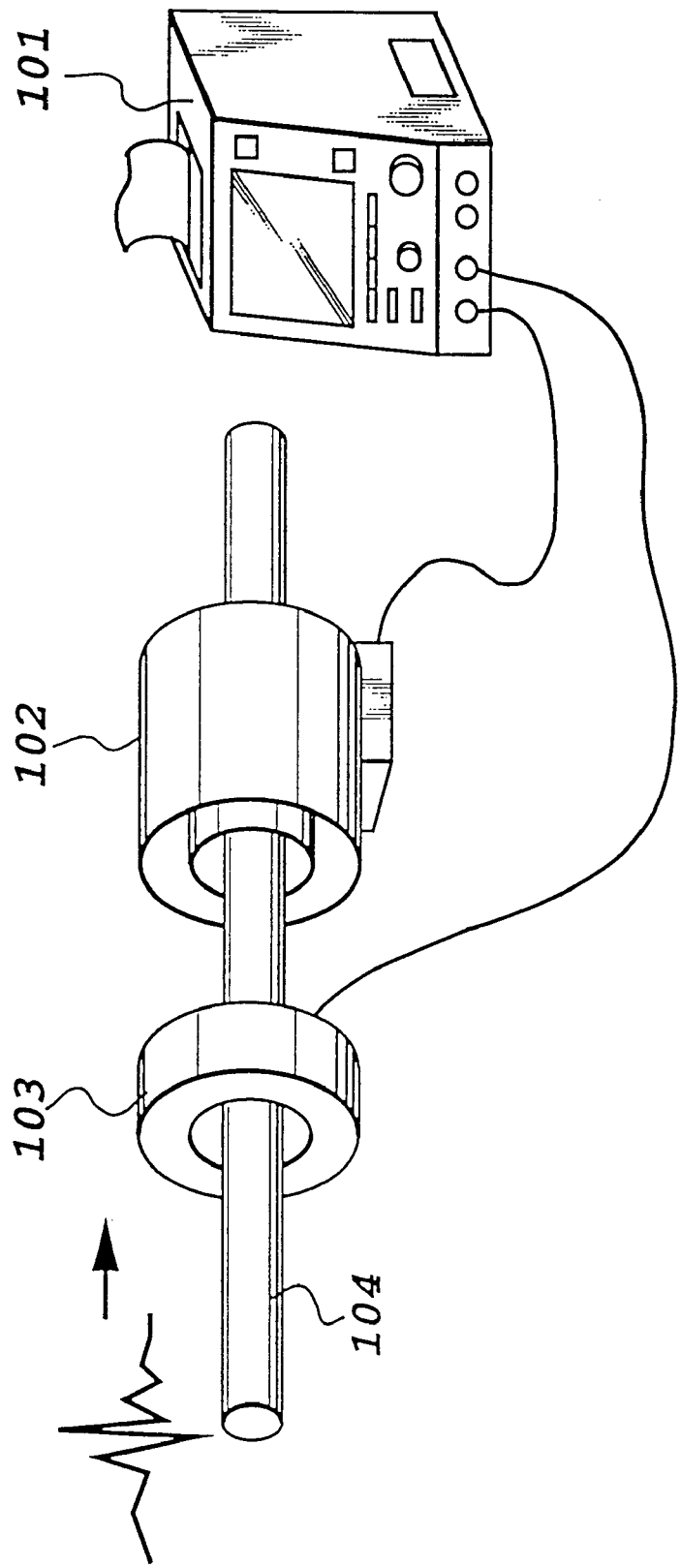
FIG. 10 is an explanatory view showing an example of a usage pattern of a fourth embodiment of the present invention.

FIG. 1 shows a first embodiment of the present invention at the time that electromagnetic interference has invaded pieces of electronic equipment. In FIG. 1, reference numerals 1 and 2 indicate electronic equipment respectively. Reference numerals 3, 4, 5, 6 and 7 respectively indicate cables or the like electrically connected to the electronic equipment 1 and 2. Reference numerals 8 and 9a respectively indicate a source for inducing electromagnetic interference and the induced electromagnetic interference. Further, reference numerals 9b, 9c and 9d respectively indicate interference that propagates through the electronic equipment 2. Reference numerals 10 indicate respectively current probe apparatuses from which positive voltages are output to a device 23 for measuring voltages and currents of incoming interference when currents flow in the directions indicated by the arrows inside the current probe apparatuses 10. Reference numerals 11 indicate voltage probe apparatuses respectively. In the present embodiment, any of the probe apparatuses 10 and 11 can be of the non-contact type. In particular, the voltage probe apparatus has a cylindrical electrode as will be described later in FIG. 18. A non-contact voltage probe apparatus for detecting a voltage through capacitive coupling is used as the voltage probe apparatus 11 and is constructed so as to be able to measure the voltage when the equipment is under operating conditions. As shown in FIG. 1, the interference 9a induced in the cable or the like 6 from the induction source 8 propagates between the cable or the like 6 and ground and toward the electronic equipment 2 in a common mode. The interference 9a that invaded the electronic equipment 2 exerts an influence on electronic circuits in the electronic equipment 2 so that the electronic equipment 2 fails to function normally. The invaded respective interference is propagated through other cables or the like 5, 4 and 7 connection to the electronic equipment 1 and 2 in the form of the interference 9b, 9c and 9d. When one attempts to make a decision as to an invading route on the basis of the magnitude of a current obtained from the result of a measurement of each interference by the conventional current probe apparatus, e.g., when resonance occurs in the cable or the like 4 in the drawing, the magnitude of the current flowing through the cable or the like 4 becomes greater than that in the cable or the like 6, so that an incorrect invading route is specified. In the present invention, however, the direction of the flow of energy can be determined by measuring the voltage and current of each of the interferences 9a through 9d with the measuring device 23 and determining the energy thereof, and thereby making it possible to judge the direction in which the interference travels. Since energy does not increase, even upon resonance, due to the conservation of energy, it is possible to eliminate the influence of increases of current or voltage on the resonance. The measuring device 23 can be constructed in a manner similar to an interference searching apparatus 101 as shown in FIG. 10.

Figure 2:
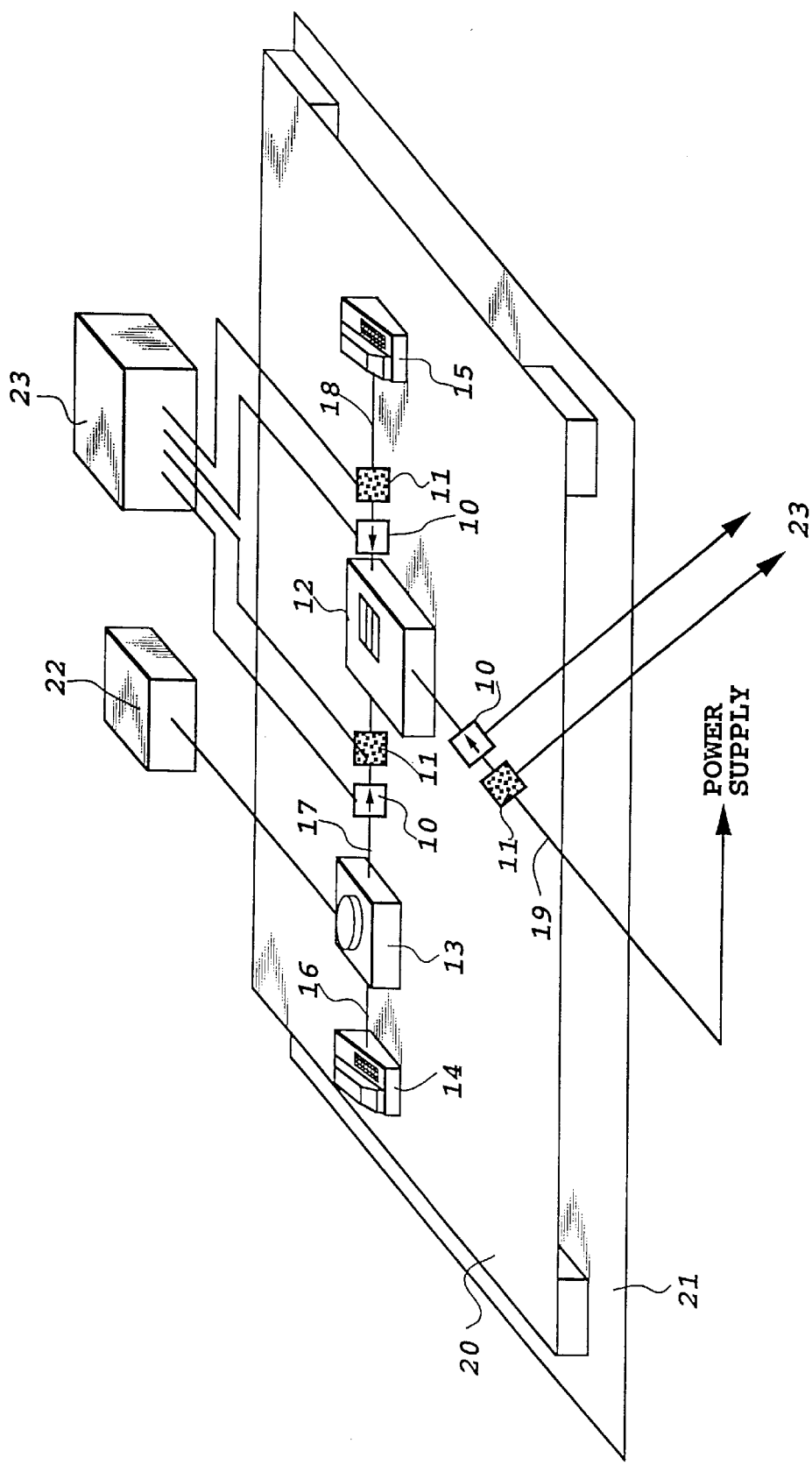
FIG. 2 is an explanatory view illustrating an example of a further specific configuration of the first embodiment of the present invention.

FIG. 2 shows another specific example of the embodiment shown in FIG. 1. In the present specific example, the voltage and current of each interference are measured in the time domain, and the measured voltage and current are Fourier-transformed. Thereafter, the energy or power of each interference is calculated. In FIG. 2, reference numeral 12 indicates a main apparatus for small telecommunication equipment. Reference numeral 13 indicates a device for applying interference to cable in the common mode. Reference numerals 14 and 15 indicate telecommunication terminals respectively. Reference numerals 16, 17 and 18 indicate telecommunication cables respectively. Reference numeral 19 indicates a power cable. Further, reference numeral 20 indicates an acrylic plate used to isolate the telecommunication equipment from the ground. Reference numeral 21 indicates a copper plate for providing the ground. Reference numeral 22 indicates an interference generator. Reference numeral 23 indicates an instrument device for measuring the voltage and current of each interference and the energy thereof, which is, for example, a combination of a digital oscilloscope capable of recording the waveform of each interference therein and a controlling and computing apparatus such as a computer.

Figure 8:
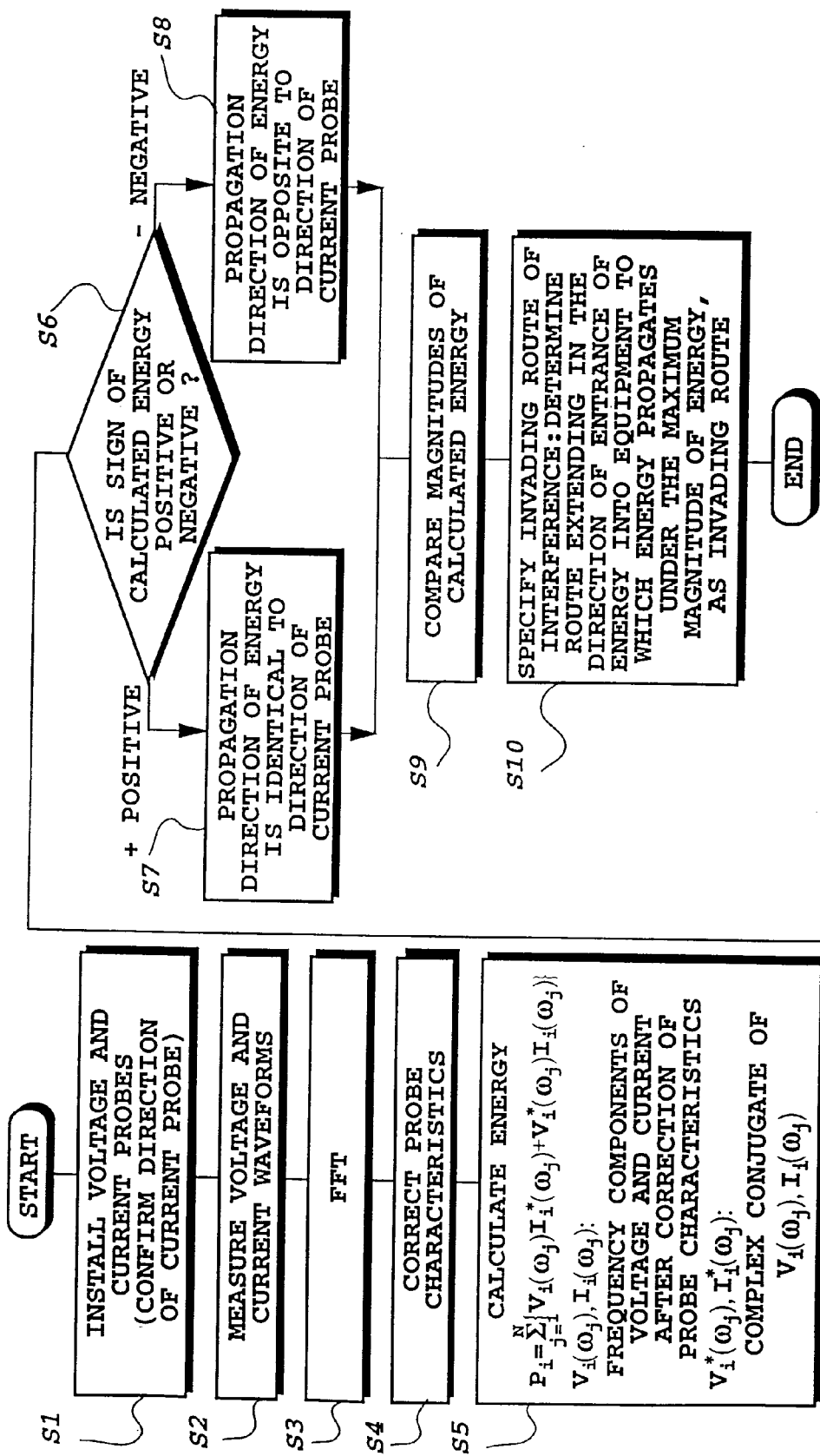
FIG. 8 is a flowchart for explaining a procedure for executing a method of specifying an interference invading route, which is employed in the first embodiment of the present invention.

FIG. 8 shows Steps S1 through S10 for describing the whole flow of a method of specifying an interference invading route, which is employed in the aforementioned embodiment.

As shown in FIG. 2, the application device 13 allows interference generated from the interference generator 22 to pass through the telecommunication cable 17 in the direction of the main apparatus 12 so as to be applied between the telecommunication cable 17 and the copper plate 21 (in the common mode). Namely, the telecommunication cable 17 in the present embodiment simulates an interference invading cable. The current probe apparatuses 10 and the voltage probe apparatuses 11 are installed in their corresponding cables 17, 18 and 19 so that the direction of the flow of current into the main apparatus 12 is taken as positive (S1).

Figure 3A:
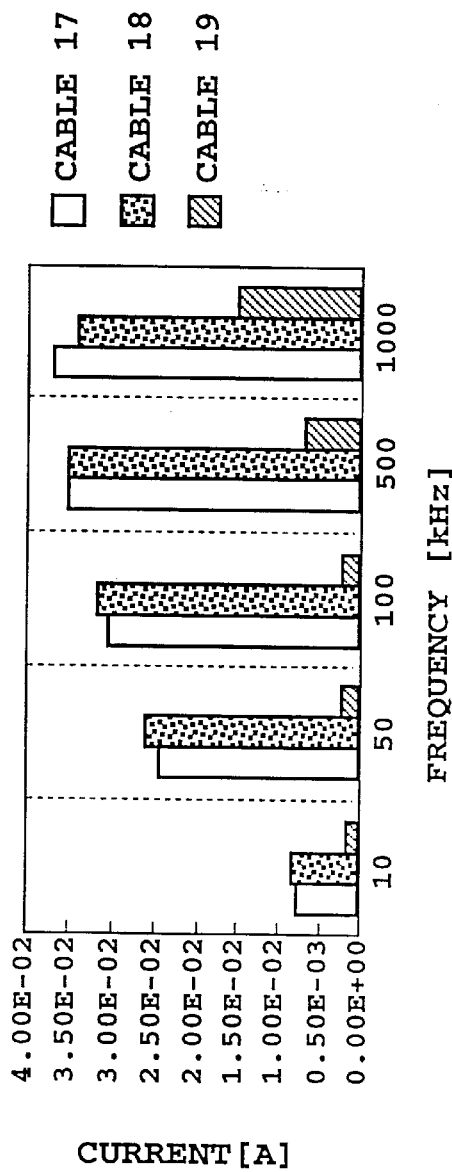
FIGS. 3A and 3B are characteristic diagrams depicting an example of the magnitudes of voltages and currents supplied to respective cables employed in the first embodiment of the present invention.
Figure 3B:
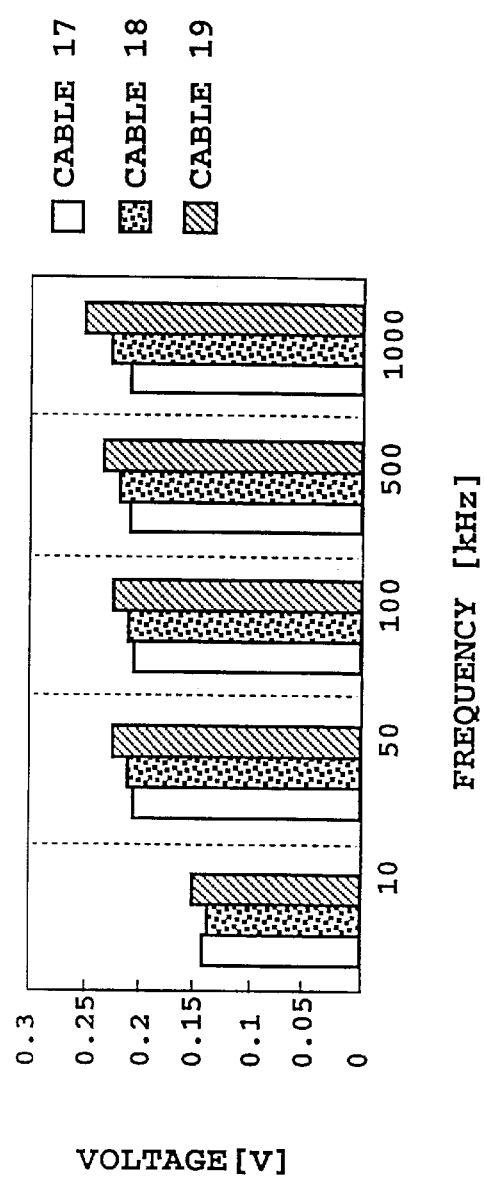

The current probe apparatuses 10 and the voltage probe apparatuses 11 installed in their corresponding cables 17, 18 and 19 respectively detect waveforms of common-mode voltages and currents supplied to the telecommunication cables 17 and 18 and the power cable 19 and supply the detected voltages and currents to the digital oscilloscope of the measuring device 23 where the energy of interference is calculated in accordance with Steps S2 through S5 in FIG. 8. Owing to the setting of the direction of each current, the direction of energy flow, i.e., the direction in which each current flows into the main apparatus 12 and the direction in which each current flows out from the main apparatus 12, are respectively taken as positive and negative. The result of measurements of the current and voltage in a frequency domain, i.e., the result of measurements of them at the time that the interference has a sinusoidal wave and the frequency of the interference is set as 10 kHz, 50 kHz, 100 kHz, 500 kHz and 1000 kHz is shown in FIG. 3. The result obtained by calculating energy from the result shown in FIG. 3 is shown on FIG. 4. As can be seen from the result of the measurements shown in FIG. 3, the values of the current or voltage at the telecommunication cable 17 corresponding to the invading route are not always maximum. Thus, it is difficult to specify the invading route from the results in FIG. 3.

Now, note the flow of energy of each interference. The value of the energy is calculated as follows. An effective component of the energy (power) of a sinusoidal signal having a single frequency is calculated from the following equation (2):

$$P = \frac{1}{2}\{V^*I + V^*I\} \qquad (2)$$

where V and I respectively represent the phaser voltage and current of the interference, and V* and I* respectively represent the complex conjugate thereof.

The interference is not normally a sinewave having a single frequency but includes various frequency components. Therefore, the waveforms of the interference voltage and current which have been measured in the time domain at Step S2, are Fourier-transformed (FFT) into data in the frequency domain (S3). The result of Fourier transformation represents a magnitude and a phase of the measured voltage and current of each frequency component. Since a value of computed energy is zero between the voltage and current at different frequencies, the interference energy is represented as the sum of the energies calculated at every frequency that constitutes the interference. Accordingly, the energy of a desired waveform can be calculated in accordance with the following equation (3):

$$P_{eff} = \sum_i \{V(\omega_i)I^*(\omega_i) + V^*(\omega_i)I(\omega_i)\} \qquad (3)$$

where $V(\omega_i)$ and $I(\omega_i)$ respectively indicate complex Fourier-transformed components calculated from the waveforms of the measured voltage v(t) and current i(t), and * indicates the complex conjugate thereof. The energy of the interference propagated through each cable is calculated from data measured from each cable using equation (3), and the magnitude or level of the energy and the direction of propagation thereof are determined, whereby the flow of energy of each interference can be recognized.

A calculating procedure will be described below.

1) The measured waveforms of interference voltage and current are converted from the time domain to the frequency domain by Fourier transformation (FFT) (S3).

2) The sensitivity of each probe apparatus is corrected (S4) and the effective component of the measured energy of each cable is calculated using equation (3) (S5).

3) The energy assumes a positive or negative value due to the setting of the polarity of the current probe apparatus. Namely, if the sign of the calculated energy is found to be positive (+) at Step S6, then the propagation direction of the energy is identical to the direction to which each current probe apparatus is set, and the routine procedure proceeds to Step S7. If the sign of the calculated energy is found to be negative (−), then the propagation direction of the energy is opposite to the direction to which the current probe apparatus is set, and the routine procedure proceeds to Step S9. At Step S9, comparisons are made between the magnitudes of the calculated energies. At the next Step S10, the invading route of each interference is specified based on the result of the comparisons in magnitude and direction determined from the sign of the energy. Namely, the route where the maximum energy propagating toward the main apparatus is determined to be an invading route.

Figure 4:
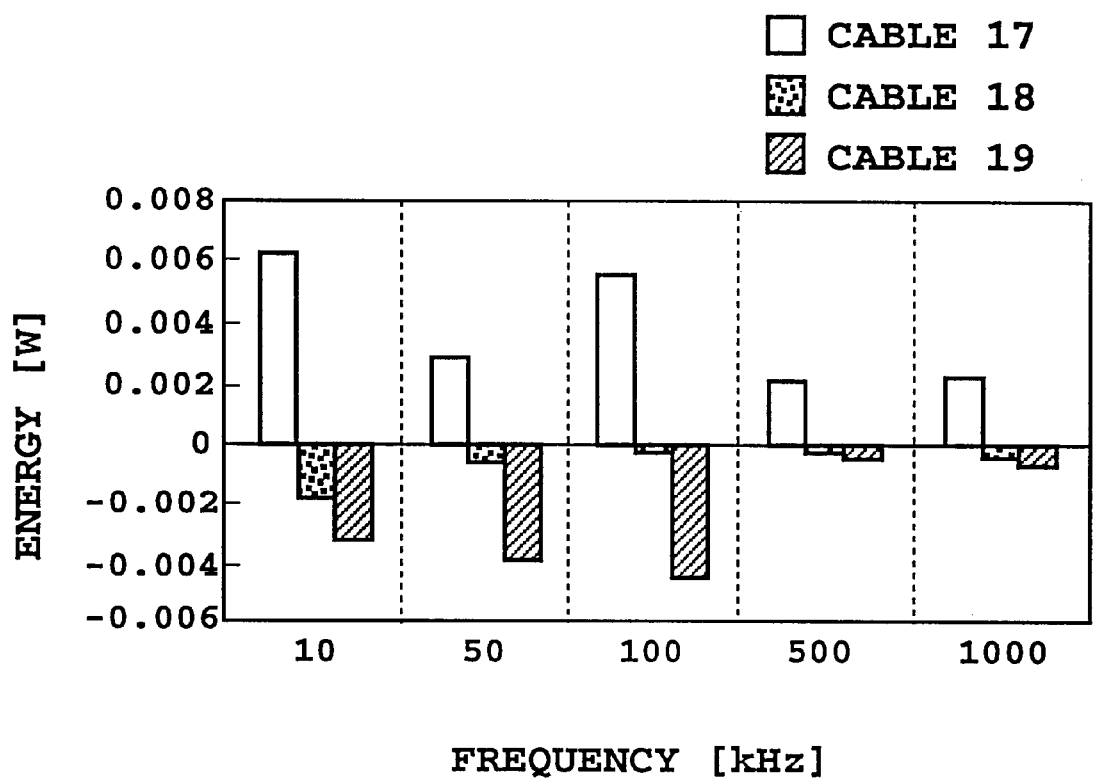
FIG. 4 is a characteristic diagram illustrating an example of the result of calculation of energy applied to the individual cables shown in FIG. 3.

It is apparent from the result of the calculation of the measured waveform data in FIG. 4 that the sign of the calculated energy is taken as positive for the telecommunication cable 17 alone. Due to the setting of the polarity of the current probes, it can be deduced that the invading route of the interference is the telecommunication cable 17. The direction of the invading route coincides with the direction of the energy in an actual measurement system. Thus, the method according to the present invention revealed that the invading route of each interference could be specified.

Second Embodiment

Figure 5:
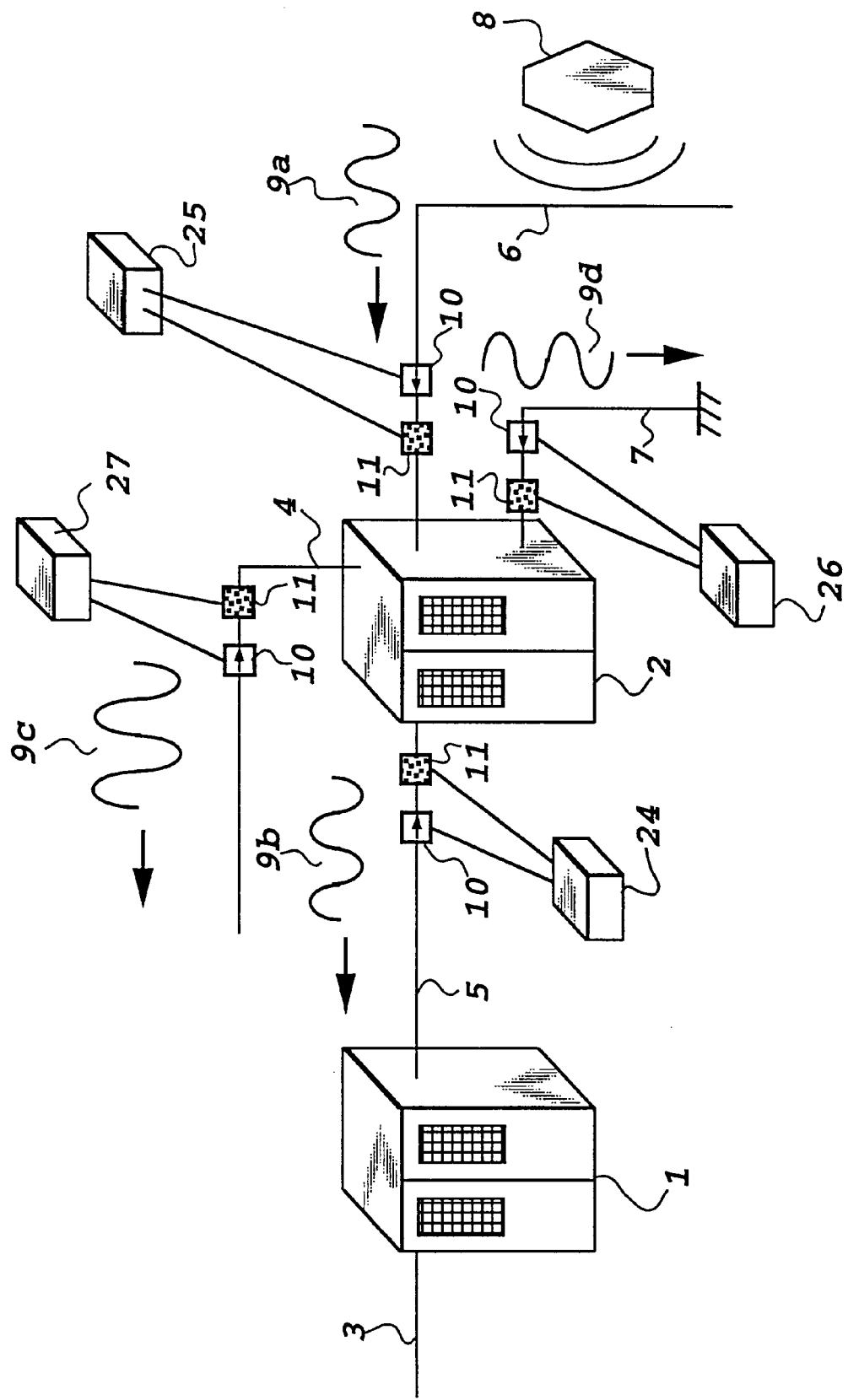
FIG. 5 is a configuration explanatory view showing a second embodiment of the present invention.
Figure 6:
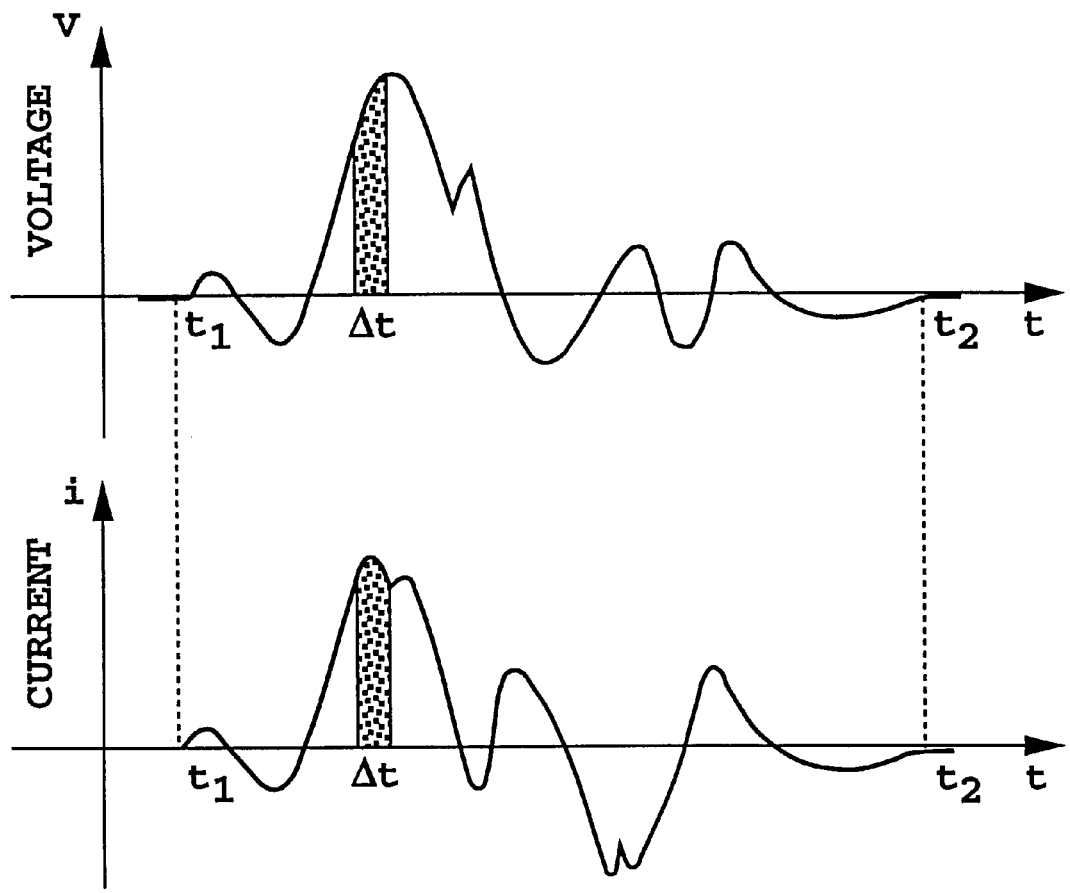
FIG. 6 is a characteristic diagram illustrating an example of a method of directly determining energy, according to the present invention.

An embodiment of the present invention, which is considered to be effective on a continuous wave in particular, is shown in FIG. 5. In FIG. 5, the same structural elements as those shown in FIG. 1 are identified by like reference numerals, and their description will therefore be omitted. In the present embodiment, the absolute values of each interference voltage and current in a frequency domain and the phase difference between the two are measured. The energy of each interference is calculated from the result of the measurements. Thus, in the present embodiment, a phase-difference measurable device such as a vector voltmeter, a network analyzer or the like is used as an alternative to the measuring device 23 shown in FIG. 1. Reference numerals 24, 25, 26 and 27 shown in the present embodiment indicate vector voltmeters respectively. An effective component of the energy of each interference can be calculated using the equation (3) from the measured absolute values of the interference voltage and current and the measured phase difference. As a result, an invading route of each interference can be specified.

The flow of a method of specifying the invading route of each interference is one obtained by removing Step S3 from the flowchart shown in FIG. 8.

Third Embodiment

The present embodiment shows an embodiment particularly effective for an impulsive interference wave. As a method of directly determining energy, there is known a method of measuring current and voltage waveforms for a time during which the interference wave is produced and obtaining a value by integrating the product of the voltage and current. The integrated value is determined in accordance with a method of calculating it by integration using an analog circuit or a method of sampling the waveforms and calculating the integrated value from the sampled values by the following equation (4):

$$\Sigma V(t_n)I(t_n)\Delta t \qquad (4)$$

Figure 7:
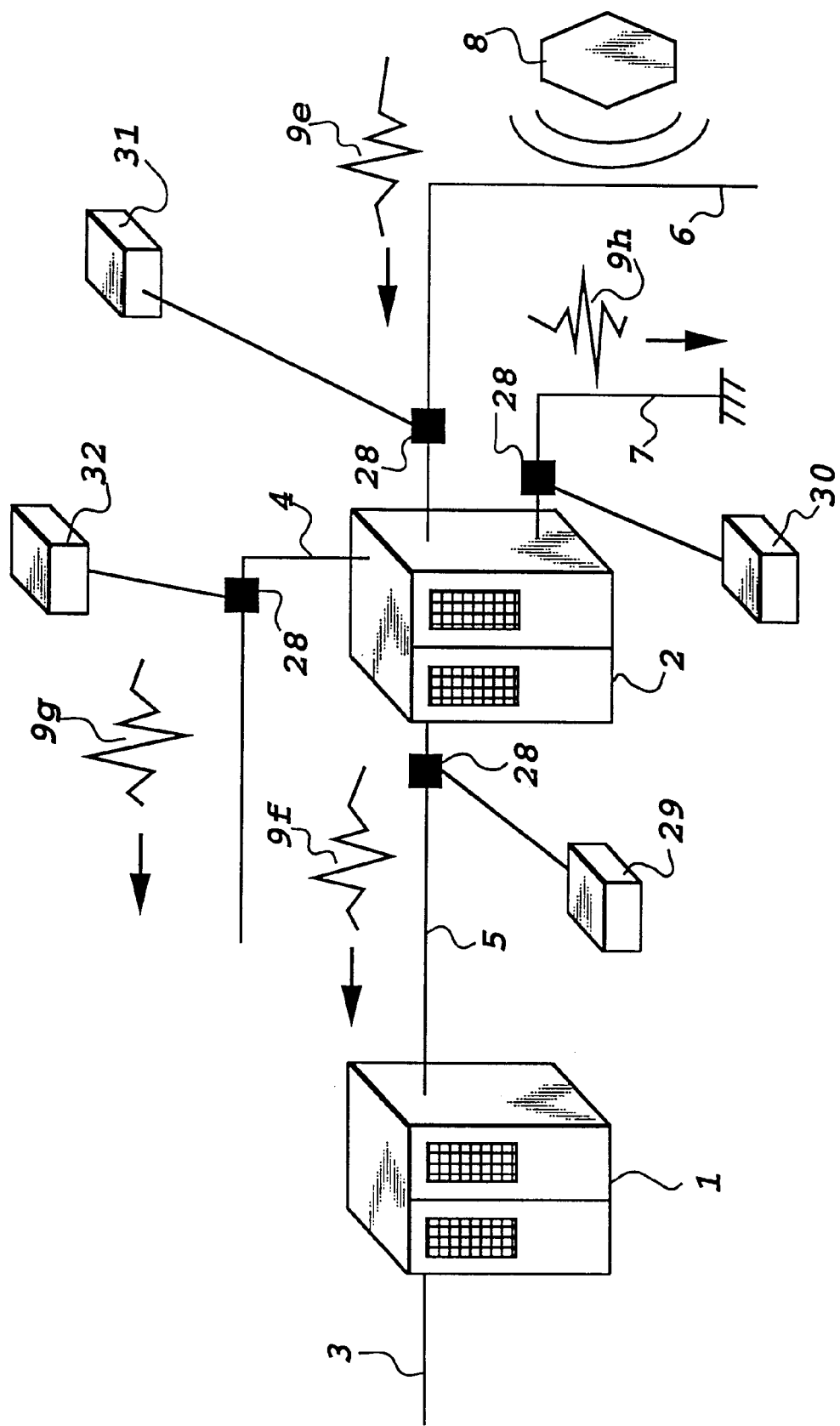
FIG. 7 is a configuration explanatory view showing a third embodiment of the present invention.
Figure 9:
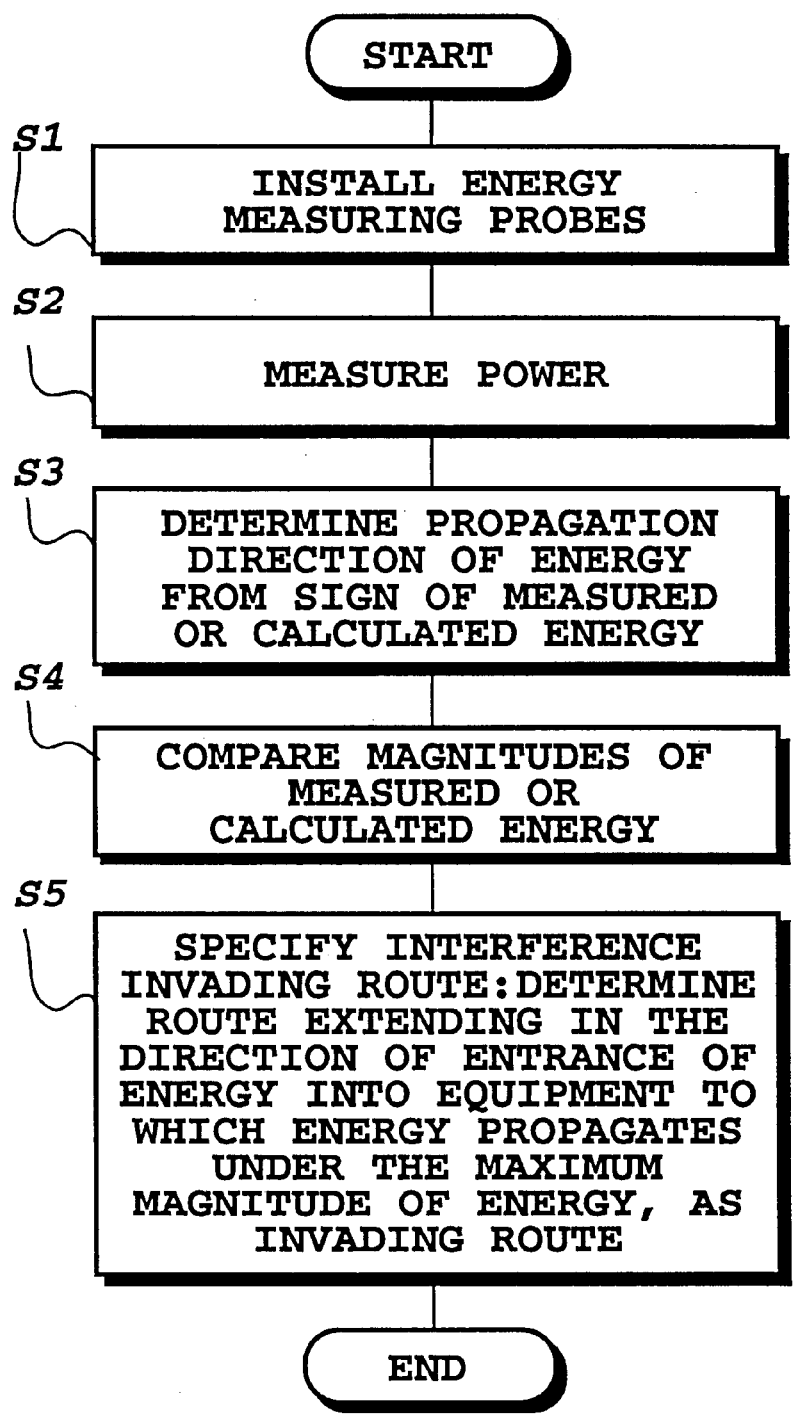
FIG. 9 is a flowchart for explaining a procedure for executing a method of specifying an interference invading route, which is employed in the third embodiment of the present invention.

FIG. 7 shows the third embodiment. In FIG. 7, the same structural elements as those shown in FIG. 1 are identified by like reference numerals, and their description will therefore be omitted. FIG. 9 shows Steps S1 through S5 indicative of the whole flow for executing a method of specifying an interference invading route employed in the present embodiment. In the present embodiment, probe apparatuses 28 each composed of a combination of voltage and current measuring devices and an energy integration circuit are provided (S1) to measure energy (power). Power measuring devices designated at numerals 29, 30, 31 and 32 respectively directly measure energies (power) of the interference propagated through the cables (S2). The direction of propagation of each energy is determined according to the sign of the measured (or calculated) energy (S3). Further, a comparison is made between the magnitudes of the measured (or calculated) energies (S4). From the result of this comparison, the invading route of each interference can be specified (S5). Namely, the route having the magnitude of its energy judged as the maximum and having its energy propagating in the direction of entering the main apparatus is judged to be an invading route.

Even in the case of single-shot interference, such as the impulsive interference wave, power is calculated in the frequency domain as an alternative to the integration of the interference wave in the time domain, and the propagation direction of the interference can be specified from the frequency spectrum of the power.

According to these embodiments of the present invention, as has been described above, the interference invading route can be easily specified by measuring the voltage and current supplied to each cable and calculating the effective energy of each interference from the waveforms of the measured voltage and current. The easy specification or the invading route permits facilitation of the determination of an interference source, whereby the cause can be eliminated. Further, since the interference invading route becomes apparent, effective countermeasures against the interference can be taken. Furthermore, since attention is focused on the effective component of energy, the influence of resonance can be eliminated.

Further, in these embodiments, an advantageous effect can be also brought about in that the measurement of the voltage and current of the interference by the non-contact probe apparatuses makes it possible to specify the invading route of each interference while the apparatus is in operation and without disturbing the operation of the apparatus.

Fourth Embodiment

Figure 11:
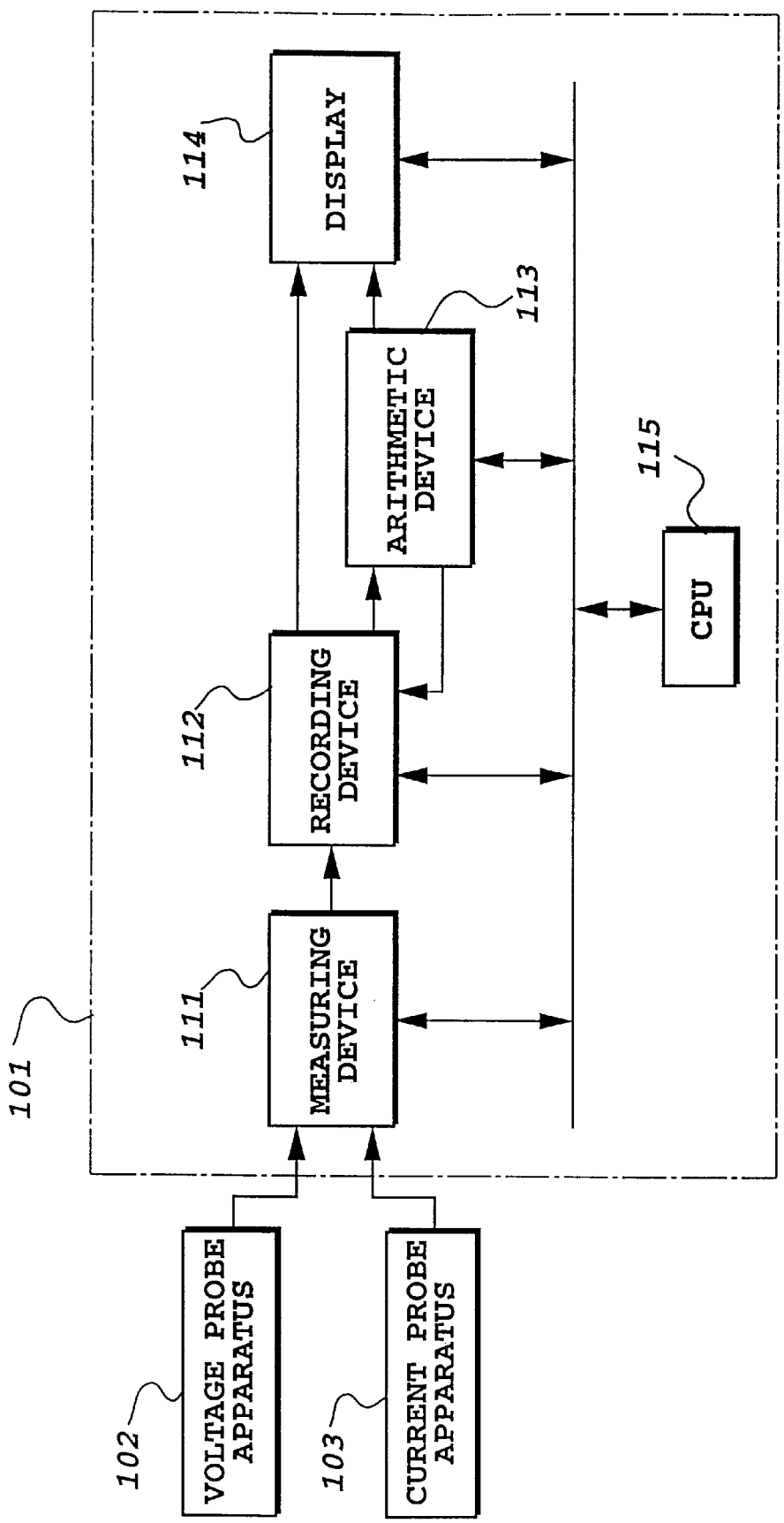
FIG. 11 is a block diagram showing the configuration of the fourth embodiment of the present invention.
Figure 12:
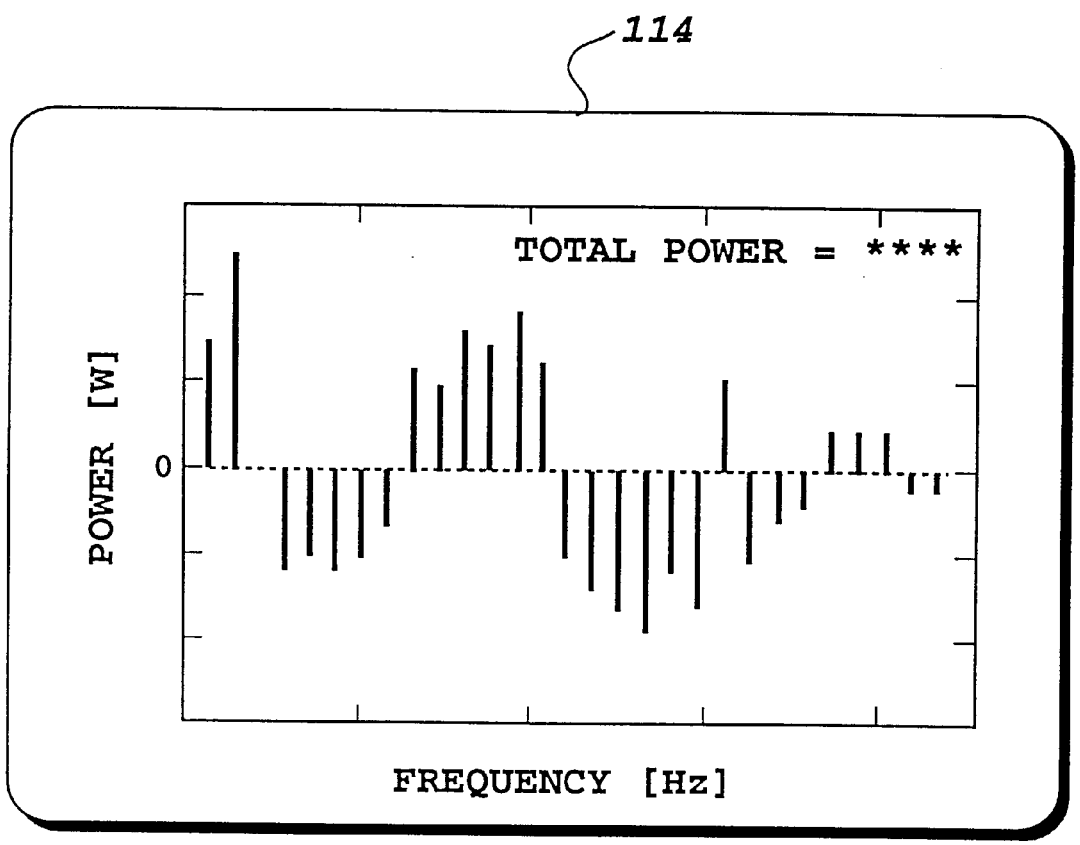
FIG. 12 is a characteristic diagram illustrating an example of the display of interference energy by the fourth embodiment of the present invention.

An embodiment will next be shown in FIGS. 10, 11 and 12, wherein the flows of energy from a plurality of interferences propagated through the cables connected to each equipment are recognized, and both the positive or negative value and magnitude of energy of each frequency component of the interference are displayed, whereby the plurality of interferences can be separated from each other, and the direction of invasion of the interference corresponding to each frequency component can be searched.

FIG. 10 shows an example of a usage form of an apparatus according to the fourth embodiment. In the drawing, reference numeral 101 indicates an apparatus for searching for an electromagnetic interference source. Reference numeral 102 indicates a probe apparatus for measuring a voltage, such as a non-contact voltage probe apparatus as shown in the drawing. Reference numeral 103 indicates a probe apparatus for measuring a current, such as an electromagnetic coupling type non-contact current probe apparatus. The use of such non-contact probe apparatuses makes it possible to measure the voltage and current of each interference while the equipment is in its usual operating state. Reference numeral 104 indicates a cable in which the interference occurs.

FIG. 11 is a block diagram showing the structure of the apparatus 101 shown in FIG. 10. The arrows shown in the drawing represent the flow of measured signal data. The probe apparatuses 102 and 103 respectively measure voltage and current waveforms of an interference signal in the time domain. These interference voltage and current waveforms in the time domain are supplied to a measuring device 111 from which A/D-converted measured data is obtained. The digital data indicative of the voltage and current waveforms obtained from the measuring device 111 is recorded in a recording device 112. An arithmetic device 113 calculates the energy of the interference for each frequency component from the data recorded in the recording device 112. The calculated energy and the measured voltage and current waveforms are displayed on a display 114. In this case, the positive or negative value and magnitude of the energy at each frequency component are displayed on the screen having coordinates for indicating the frequency. Reference numeral 115 indicates a CPU for controlling the respective components 111 through 114 of the apparatus 101. In FIG. 11, the voltage probe apparatus 102 and the current probe apparatus 103 will be constructed as in the case of the voltage probe apparatuses 11 and the current probe apparatuses 10 shown in FIG. 1, for example. Namely, a plurality of voltage and current probe apparatuses attached to a plurality of cables will be collectively represented respectively. The measuring device 23 shown in FIG. 1 can also be constructed as illustrated in FIG. 11.

The propagation direction of the interference is determined in accordance with the following procedures under the control of the CPU 115.

(a) The probe apparatuses 102 and 103 respectively measure the voltage and current of an interference signal in the time domain, and the measuring device 111 converts the measured outputs into digital data.

(b) The arithmetic device 113 converts the data indicative of the waveforms of the interference voltage and current from data in the time domain to data in the frequency domain.

(c) After the properties of the probe apparatuses 102 and 103 have been corrected by the arithmetic device 113, the arithmetic device 113 calculates the measured energy on each cable for each frequency component.

(d) The polarity of the current probe is set in the arithmetic device 113 in advance, and the energy assumes a positive or negative value according to The setting of the polarity of the current probe. The sign of the energy and the magnitude of the calculated energy are displayed on the display 114 or the like.

(e) The propagation direction of the interference is visually specified from the result of the display.

Alternatively, the CPU can determine the propagation direction of the interference from the sign indicative of the direction of the energy and the magnitude of the energy both obtained in paragraph (d).

Now, the display of the interference energy on the display 114 as defined in paragraph (d) is equivalent to one shown in FIG. 12, for example. In FIG. 12, the frequency is represented on the abscissa, and the power of the energy along with its sign is represented on the ordinate. Since a plurality of interferences normally have their individual frequency spectrums, they can be identified by analyzing their individual frequency spectrums. Even when, for example, two interferences are found to have invaded from different routes respectively, they can be separated by focusing attention on the frequency components thereof as shown in the display of the energy in the frequency domain, whereby the invading routes of the two interferences can be determined. A value (total power) obtained by adding together the energies at every frequency component can be displayed at the top of the display screen. As can be seen from the example shown in FIG. 12, the interference is likely to have both positive and negative values side-by-side.

Namely, according to the method of measuring the electromagnetic interference source, wherein the effective component of the energy of each propagating interference is calculated from the electromagnetic interference voltage and current induced in each cable or the like, and wherein the propagation direction of the electromagnetic interference is specified from the magnitude and flow of the energy, the waveforms of the interference voltage and current in the time domain are measured. The measured voltage waveform v(t) and current waveform i(t) are transformed from the data in the time domain to the data in the frequency domain, and then the respective frequency components of the interference are determined. Further, the effective component of the energy is calculated at each frequency component. As a result, the plurality of interferences can be separated from the energy, and thereby the propagation direction of each interference can be specified.

As described above, the propagation direction of each interference can be easily determined by measuring the voltages and currents supplied to the plurality of cables and calculating the effective energies of the plurality of interferences from the waveforms of the voltages and currents so as to separate the respective interferences. Since the propagation direction of each interference can be easily specified using the apparatus according to the present invention, the following advantageous effects can be brought about:

(1) The interference source can be easily specified so that the cause can be removed.

(2) Since the propagation direction of each interference becomes apparent, effective countermeasures against the interference can be taken.

(3) Since attention is focused on the effective components of the energy, the present determination method of the interference invading route is not affected by resonance.

(4) Owing to the evaluation of the energy in the frequency domain, a plurality of interferences having frequency components different from each other can be separated, and then the invading route of the each interference can be determined.

Further, the measurement of the voltage and current of the interference by the non-contact probe apparatuses makes it possible to specify the propagation direction of each interference while the electronic equipment is in operation and without deactivating the equipment.

According to the fourth embodiment, as has been described above, the behavior of each interference can be accurately grasped while the apparatus is in an operating state. The propagation direction of the electromagnetic interference can be quantitatively specified according to the physical quality. Further, the plurality of interferences can be searched by separation.

Fifth Embodiment

Figure 13:
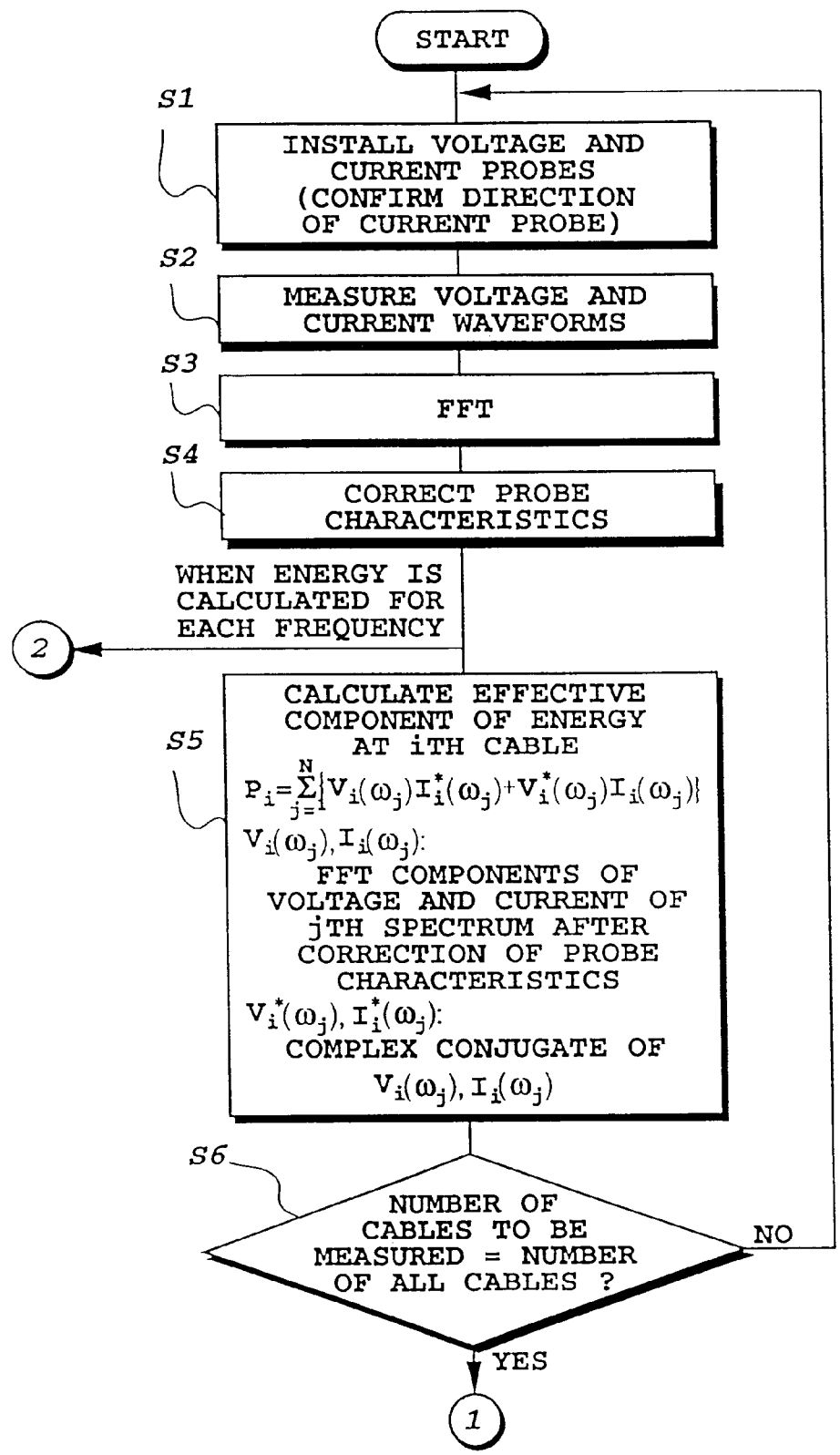
FIG. 13 is a flowchart for explaining an example of a procedure for calculating energy by a fifth embodiment of the present invention.
Figure 14B:
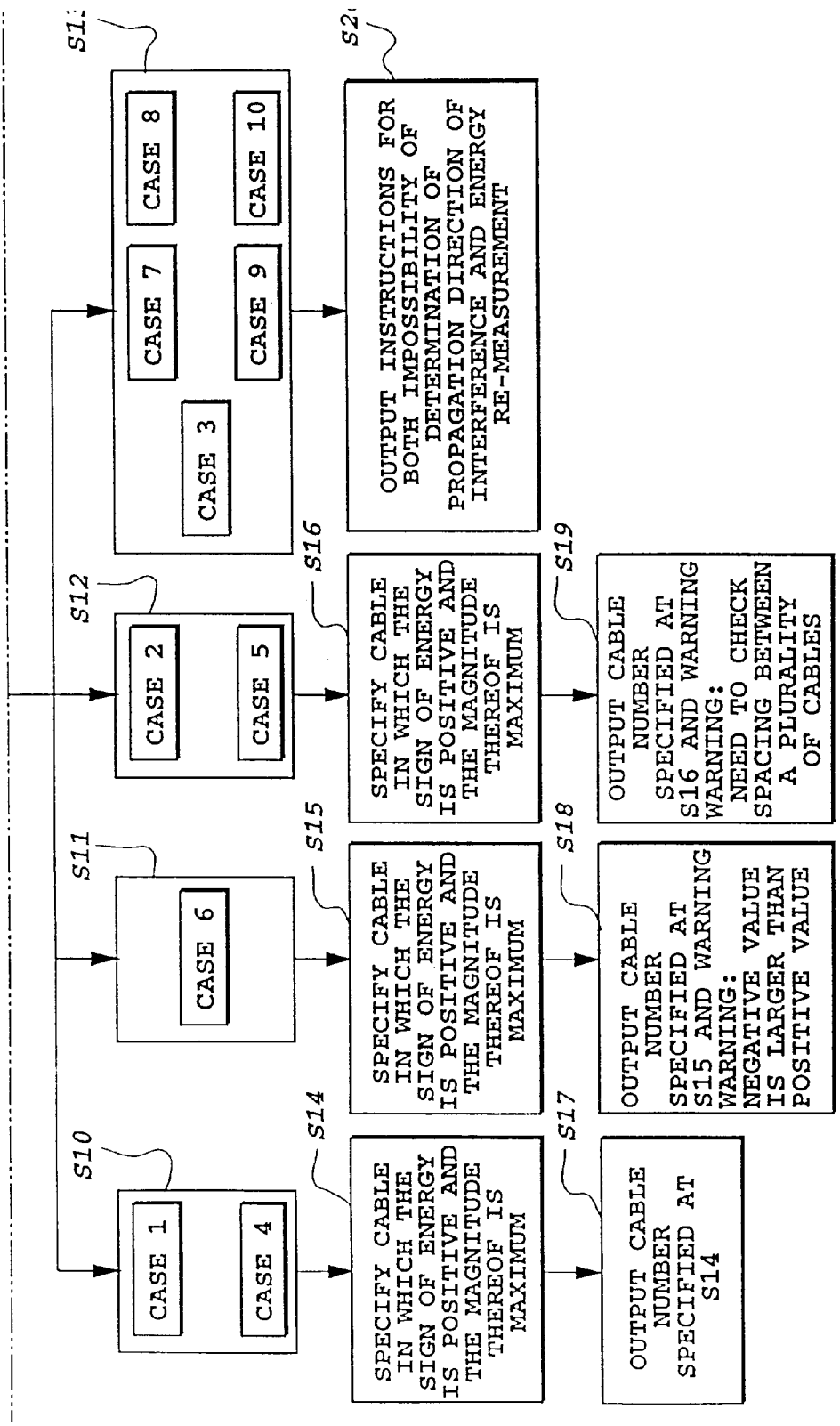
Figure 15A:
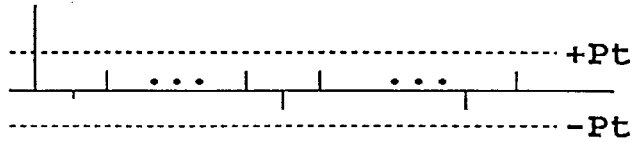
FIGS. 15A through 15J are respectively explanatory views showing cases obtained by dividing a combination of the power and direction of energy at Step 9 shown in FIGS. 14A and 14B.
Figure 15B:
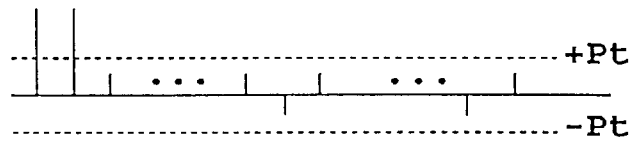
Figure 15C:
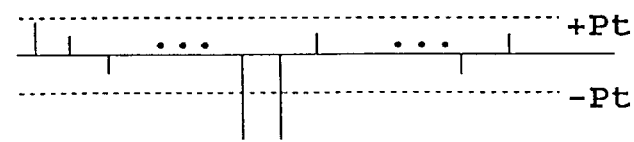
Figure 15D:
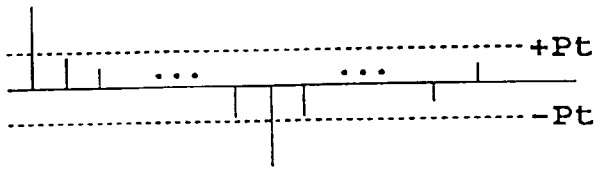
Figure 15E:
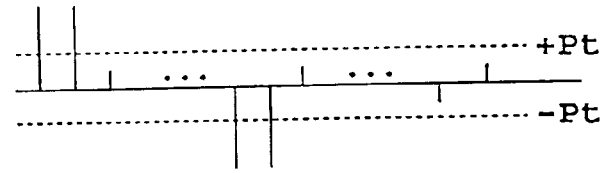
Figure 15F:
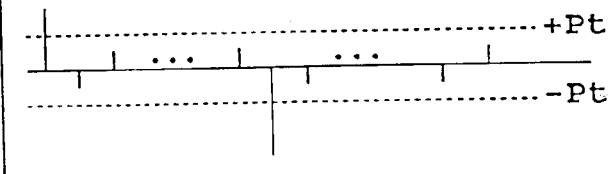
Figure 15G:
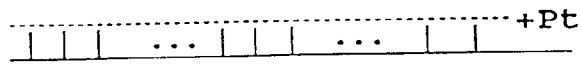
Figure 15H:
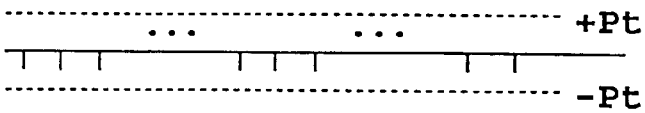
Figure 15I:
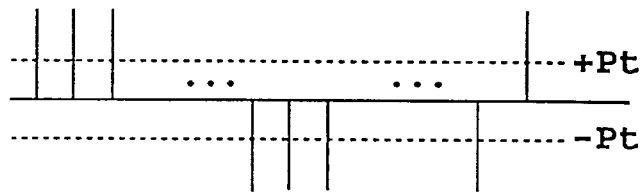
Figure 15J:
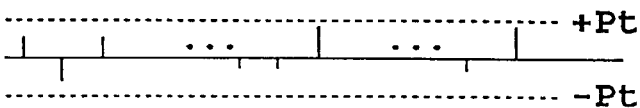

The fifth embodiment shows a further detailed example of the first embodiment for making a decision as to the invading route of each interference in accordance with the procedure shown in FIG. 8. The present embodiment utilizes the same construction as that shown in FIG. 11. The entire processing is controlled by the CPU 115. FIG. 13 and FIGS. 14A and 14B respectively show energy calculating flowcharts used in the fifth embodiment.

Referring to FIG. 13, Steps S1 through S5 are similar to those shown in FIG. 8, and their description will therefore be omitted. It is judged at Step S6 whether the number of cables measured has reached the number of all cables n. If the answer is found to be Yes at Step S6, then the routine procedure proceeds to the next Steps S7 and S8 in FIG. 14A. Here, the magnitude of the energy is evaluated based on the sum of the frequency components.

In FIGS. 14A and 14B, especially in FIG. 14A, a decision is made as to the sign of the energy propagated through each cable at Step S7. In the following description, it is assumed that the polarity of the current probe apparatus is positive when the interference current flows into the equipment. If the energy is found to be positive at Step S7, then the propagation direction of the energy is judged as the entrance direction into the equipment. If the energy is found to be negative at Step S7, then the propagation direction of the energy is judged as the exit direction from the equipment.

At Step S8, a comparison is made between the energies appearing in the respective cables. To perform the comparison therebetween, the energy is first normalized at the maximum value. A threshold Pt is set for comparison of the magnitude of the energy. If the energy is greater than the threshold Pt, it is then regarded as a large value. On the other hand, if the energy is less than or equal to the threshold Pt, it is then regarded as a small value.

At the next Step S9, a combination of the sign and magnitude of the energy, which has been determined at Steps S7 and S8, is classified as any of Cases 1 through 10 shown in FIGS. 15A through 15J. When the combination falls into either Case 1 or 4, then the routine procedure proceeds to Step S10 in FIG. 14B. If the combination falls into Case 6, then the routine procedure proceeds to Step S11 in FIG. 14B. If the combination falls into either Case 2 or 5, then the routine procedure proceeds to S12. Further, if the combination falls into Case 3, 7, &, 9 or 10, then the routine procedure proceeds to Step S13 in FIG. 14B. Referring to FIGS. 15A through 15J, 1, 2, . . . , n respectively indicate cable numbers. These Cases 1 through 10 are summarized in the following Table 1.

TABLE 1

| Case | Combination of magnitude and direction (sign) of energy |
|---|---|
| 1 | A large value exists on the positive side |
| 2 | Several large values exist on the positive side |
| 3 | Several large values exist on the negative side |
| 4 | Large values similar in level to each other exist on the positive and negative sides |
| 5 | Several large values similar in level to each other exist on the positive and negative sides respectively |
| 6 | Large values exist on the positive and negative sides, and one on the negative side is larger than that on the positive side |
| 7 | Small values similar in level to each other exist on the positive side alone |
| 8 | Small values similar in level to each other exist on the negative side alone |
| 9 | Many large values exist on the positive and negative sides |
| 10 | Small values similar in level to each other exist on the positive and negative sides |

At the next Steps S14, S15 and S16 in FIG. 14B, shifted respectively from the Case selection at Steps S10, S11 and S12, the cable is specified in which the sign of the energy propagated therethrough is judged as positive and the magnitude of the energy is at maximum. At Step S17, the cable number specified at Step S14 is output in the form of a display or print. At Step S18, the number of the cable specified at Step S15 is output, and a warning to the effect that "the negative value is larger than the positive value" is also output. At Step S19, the number of the cable specified at Step S16 is output, and a warning to the effect that "it is necessary to examine the spacing between a plurality of cables" is also output. Because there is the possibility that interference is induced from the same interference source in a plurality of cables when the spacing between the cables is narrow, the spacing between the cables is in need of checking.

At the next Step S20 shifted from the Case selection at Step S13, instructions for both the impossibility of determination of the propagation direction of the interference and the re-measurement of power are output.

Sixth Embodiments

Figure 16:
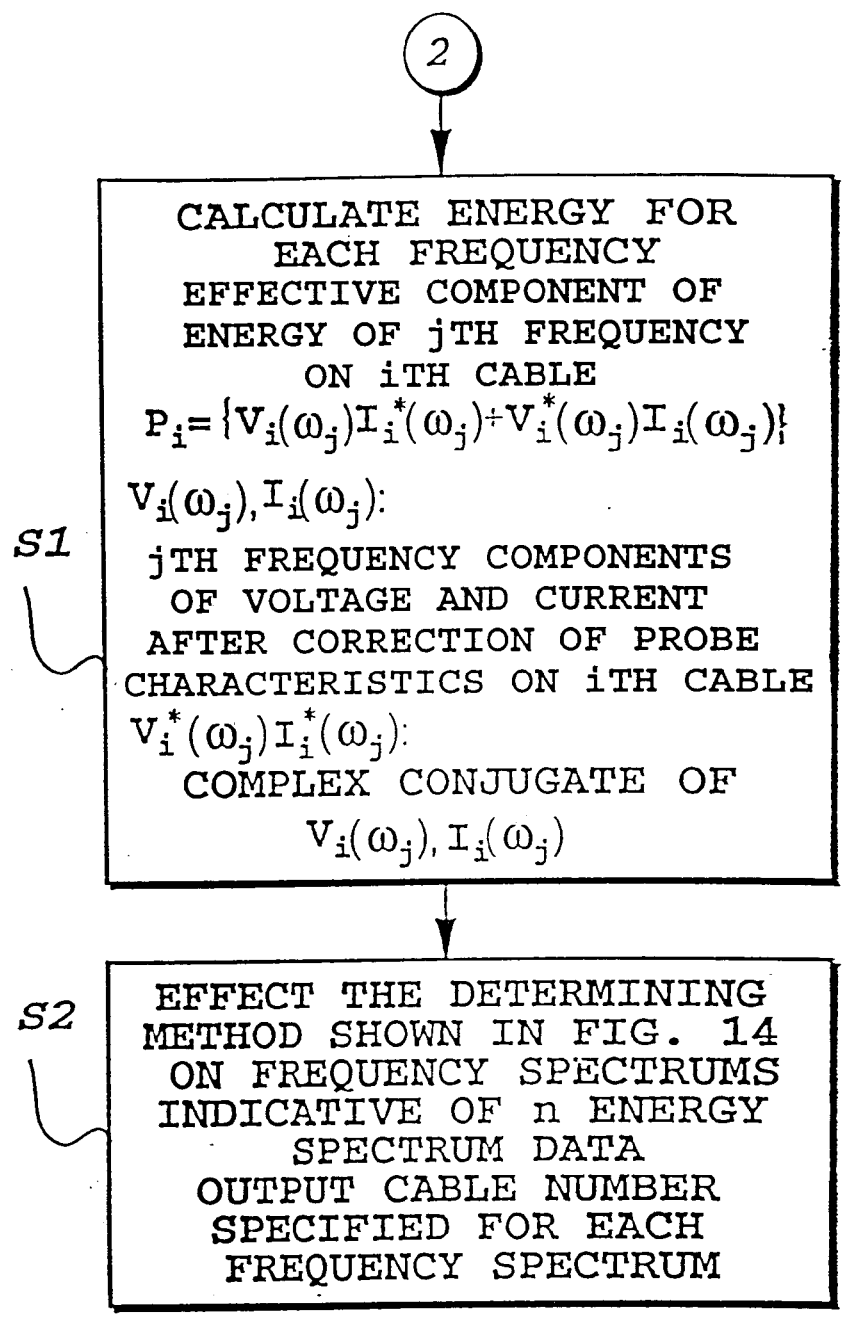
FIG. 16 is a flowchart for describing an example of a determining procedure in a frequency domain, which is employed in a sixth embodiment of the present invention.

FIG. 16 shows one example of a further specific procedure for determining the propagation direction of energy in the frequency domain, which is executed in the fourth embodiment for specifying the invading routes of the plurality of interferences. When it is desired to calculate the energy for each frequency after completion of the processes from Step S1 to Step S4 in FIG. 13, the procedure proceeds to Step S1 shown in FIG. 16. At Step S1, the energy for each frequency is calculated from a computational expression shown in the drawing. At the next Step S2, the process shown in FIG. 14 is applied to each frequency component respectively, and then data about the m energy components is thereby used to make a decision as to the propagation direction of the interference for each frequency. Based on the result of this decision, the number of the cable specified at each frequency spectrum is output.

Seventh Embodiment

Figure 17A:
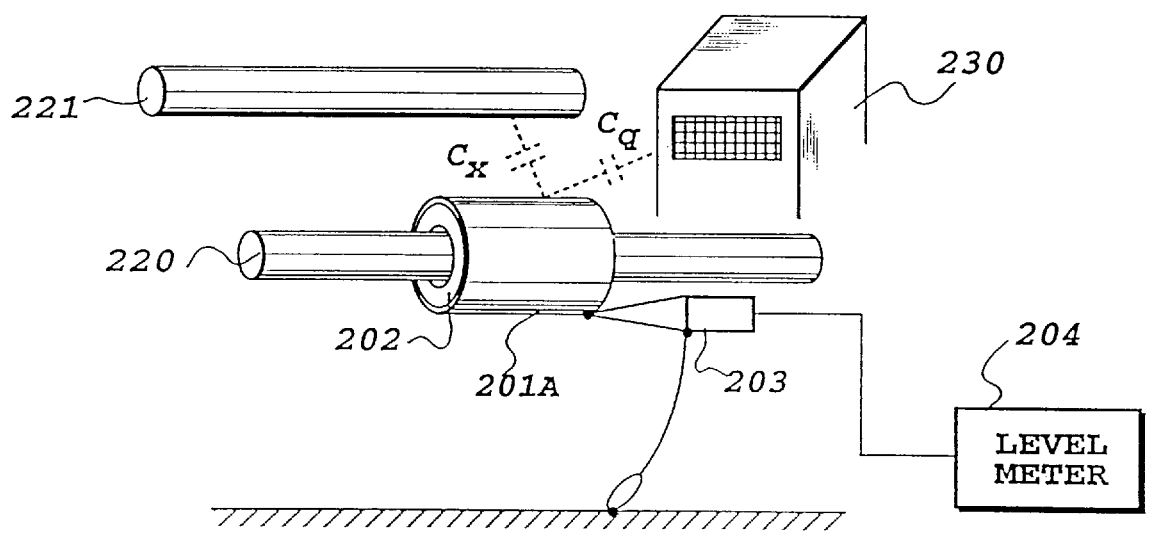
FIG. 17A is a perspective view showing the configuration of a conventional non-contact voltage probe apparatus.
Figure 17B:
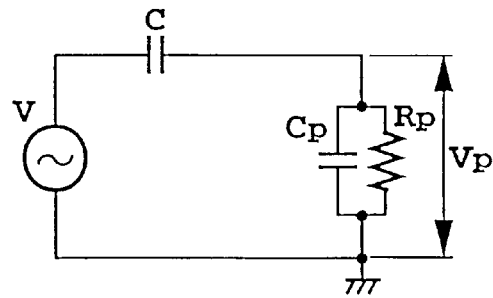
FIGS. 17B and 17C are respectively equivalent circuit diagrams of the non-contact voltage probe apparatus shown in FIG. 17A.
Figure 18:
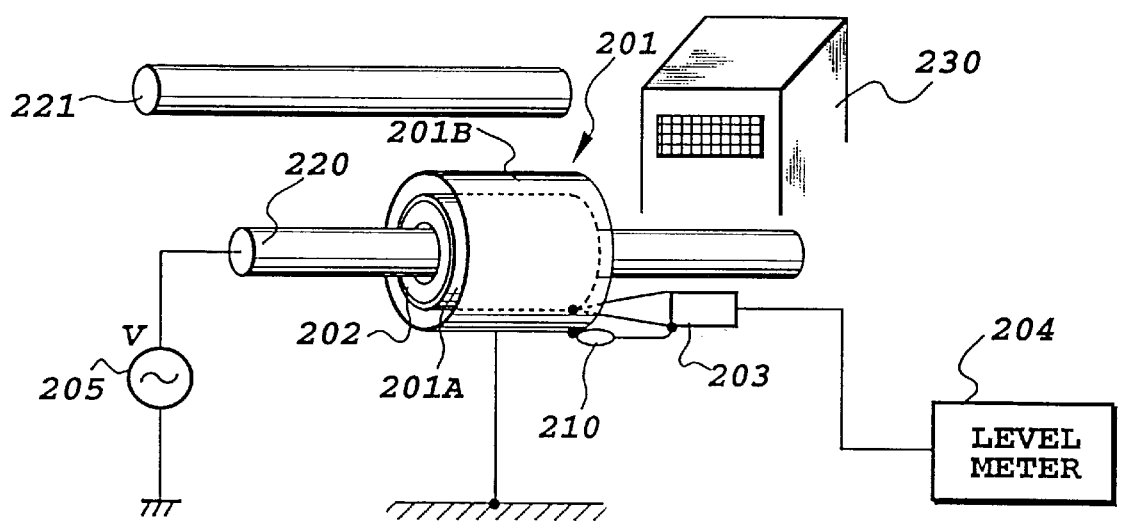
FIG. 18 is a configuration explanatory view illustrating the non-contact voltage probe apparatus shown in FIG. 17D.

FIG. 18 shows one example of a non-contact voltage probe apparatus according to the present invention. In FIG. 18, the same elements of structure as those shown in FIG. 17A will be identified by like reference numerals.

In FIG. 18, reference numeral 201 indicates a non-contact electrode for detecting a voltage applied to the cable 220 under non-contact, which includes a cylindrical inner electrode 201A for allowing a cable 220 to run therethrough and a coaxial cylindrical outer electrode 201B provided coaxially with the inner electrode 201A so as to surround it. Reference numeral 202 indicates a fixing jig made of an insulating material for fixing the cable 220 to the inside of the cylindrical inner electrode 201A. Reference numeral 203 indicates a high input impedance voltage probe capable of being composed of a high input impedance voltage detecting circuit using active elements (e.g., transistor, FET, etc.).

The non-contact voltage probe apparatus has a connecting conductive line or connecting terminal 210 for electrically connecting the coaxial cylindrical outer electrode 201B to ground of the high input impedance voltage probe 203 and grounding the coaxial cylindrical outer electrode 201B. The provision of the connecting terminal 210 prevents a change in the sensitivity of the probe due to a change in the capacitance between the cylindrical inner electrode 201A and a metal body 23 provided therearound and/or the influence of a voltage applies to the surrounding cable 221. The interposition of a plastic or foamed material having low dielectric constant between the cylindrical inner electrode 201A and the coaxial cylindrical outer electrode 201B permits a reduction in the capacitance between the cylindrical inner electrode 201A and the coaxial cylindrical outer electrode 201B and an improvement in the sensitivity of the probe.

In the case where the connecting terminal 210 cannot be connected directly to ground, a metal plate is disposed under the entire non-contact voltage probe apparatus, and the connecting terminal 210 is electrically connected to the metal plate. As a result, the coaxial cylindrical outer electrode 201B is electrically connected to ground so that the capacitance is interposed between the metal plate and the coaxial cylindrical outer electrode 201B.

Reference numeral 204 indicates a level meter. The level meter 204 may be one such as an oscilloscope if it can be used as a device for measuring a voltage. Alternatively, the measuring device 23 shown in FIG. 1 or the searching apparatus 101 shown in FIG. 11 may be used. The non-contact voltage probe apparatus shown in FIG. 18 takes out or extracts a change in the voltage supplied to the cable 220 by the capacitive coupling between the cable 220 and the cylindrical inner electrode 201A. A conductor having high conductivity, such as copper, aluminum car or the like is used as a material for the coaxial cylindrical outer electrode 201B. Further, the jig 202 for fixing the cable 220 is made of an insulating material and keeps constant the distance between the cable 220 running into the cylindrical inner electrode 201A and the cylindrical inner electrode 201A so that the capacitance between the cylindrical inner electrode 201A and the cable 220 is held constant. If a voltage probe, whose input impedance is represented by a parallel circuit composed of a resistance and a capacitance, is used as the high input impedance voltage probe 203, then a substantially flat characteristic is obtained in the case of a cutoff frequency or higher.

Now consider that a voltage V is developed between the cable 220 running into the cylindrical inner electrode 201A and ground (the voltage V is given by a power source 205 in the drawing). At this time, the cable 220 and the cylindrical inner electrode 201A are placed under capacitive coupling. The degree of coupling that exists between the cable 220 and the cylindrical inner electrode 201A, i.e., a capacitance C between the cable 220 and the cylindrical inner electrode 201A, can be approximated by the following equation (5):

$$c = 2\pi\epsilon_o\epsilon_r l / \log_e(b/a) \qquad (5)$$

where $\epsilon_o$, $\epsilon_r$, a, b and l respectively indicate dielectric constant in a vacuum, the relative dielectric constant of the jig 202, the conductor outer diameter of the cable 202 running into the cylindrical inner electrode 201A, the inside diameter of the cylindrical inner electrode 201A and the length of each of the cylindrical electrodes 201A and 201B. Further, a capacitance Cs between the cylindrical inner electrode 201A and the coaxial cylindrical outer electrode 201B is similarly approximated by the following equation (6):

$$C = 2\pi\epsilon_o\epsilon_r l / \log_e(d/c) \qquad (6)$$

where c, d and l respectively indicate the outside diameter of the cylindrical inner electrode 201A, the inside diameter of the cylindrical outer electrode 201B and the lengths of the cylindrical electrodes 201A and 201B.

Figure 19:
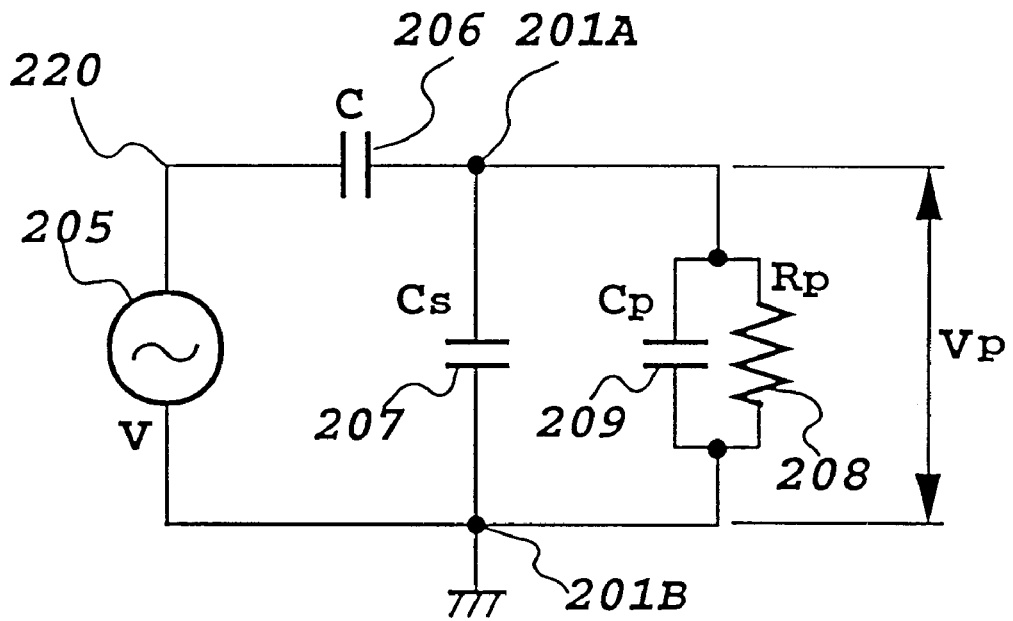
FIG. 19 is an equivalent circuit diagram of the non-contact voltage probe apparatus shown in FIG. 18.

Assuming now that the input resistance and capacitance of the high input impedance voltage probe 203 are $R_p$ and $C_p$ respectively, the non-contact voltage probe apparatus is represented as an equivalent circuit shown in FIG. 19. In FIG. 19, reference numeral 205 indicates the voltage source that simulates the voltage V induced between cable 220 and ground. Reference numeral 206 indicates the capacitance C between the cable 220 and the cylindrical inner electrode 201A. Reference numeral 207 indicates the capacitance $C_s$ between the cylindrical inner electrode 201A and the cylindrical outer electrode 201B. Further, reference numerals 208 and 209 respectively indicate the input resistance $R_p$ and input capacitance $C_p$ of the high input impedance voltage probe 203. An output voltage measured by the level meter 204 through the equivalent circuit, i.e., a voltage $V_p$ obtained across terminals of $R_p$ or $C_p$ in the equivalent circuit is given by the following equation:

$$V_p = j\omega C R_p / \{1 + j\omega R_p(C + C_p + C_s)\} \times V \qquad (7)$$

For the frequency range of $\omega R_p(C+C_p) \gg 1$, the output voltage $V_p$ of the probe 203 is given by the following equation:

$$V_p = C/(C+C_p+C_s) \times V \qquad (8)$$

Thus, flat sensitivity is obtained and is independent of the frequency.

Figure 17C:
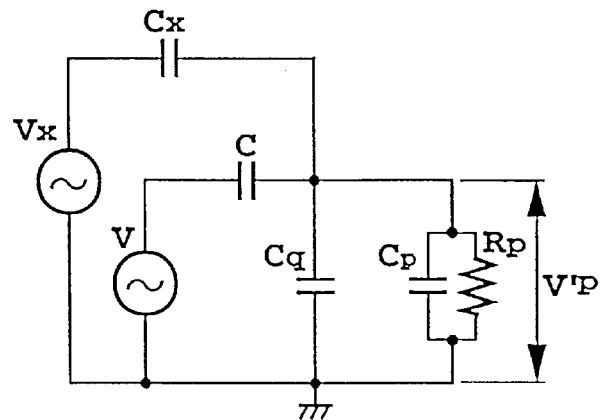
Figure 17D:
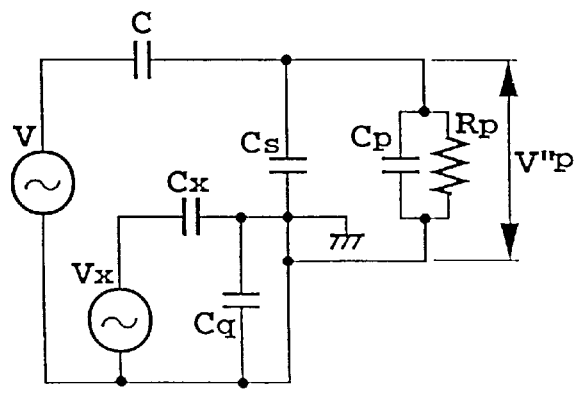
FIG. 17D is an equivalent circuit diagram of a non-contact voltage probe apparatus according to a seventh embodiment of the present invention, which is shown in contrast with FIG. 17C.

Since the cylindrical outer electrode 201B is externally provided and grounded, the non-contact voltage probe apparatus according to the present invention can eliminate an influence exerted from the outside as compared with the conventional non-contact voltage probe apparatus. FIG. 17D showing an equivalent circuit of a probe apparatus according to the present invention corresponds to FIG. 17C showing an equivalent circuit of the conventional non-contact voltage probe apparatus which has taken into account ambient influences. The equivalent circuit shown in FIG. 17D is equal to the equivalent circuit illustrated in FIG. 19. It is understood that $C_x$, $C_q$, and $V_x$ that lead to errors can be removed from the equivalent circuit shown in FIG. 17D by grounding the cylindrical outer electrode 201B.

Eighth Embodiments

Figure 20A:
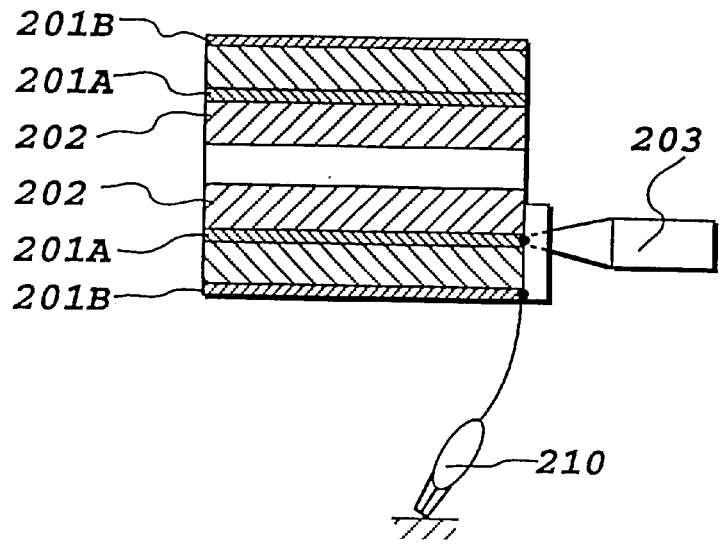
FIGS. 20A and 20B are respectively sectional and front views showing a non-contact voltage probe apparatus according to an eighth embodiment of the present invention.
Figure 20B:
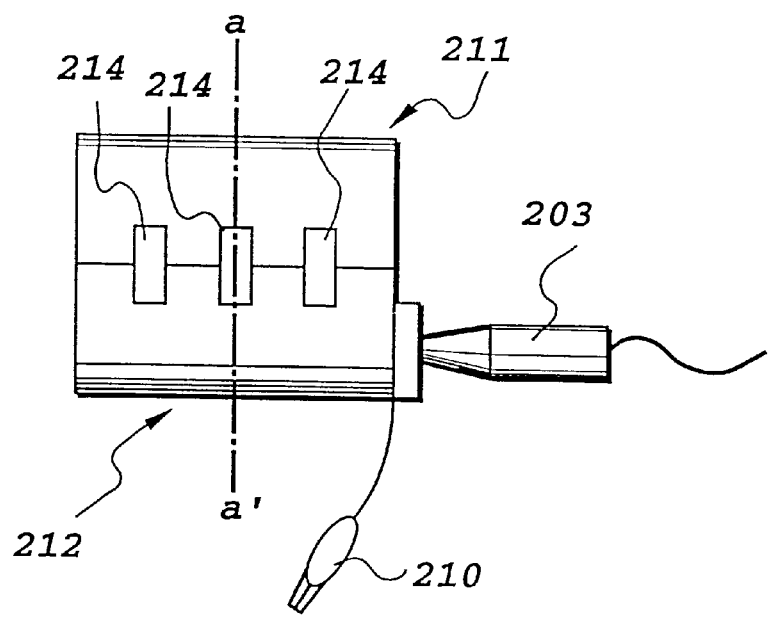
Figure 21A:
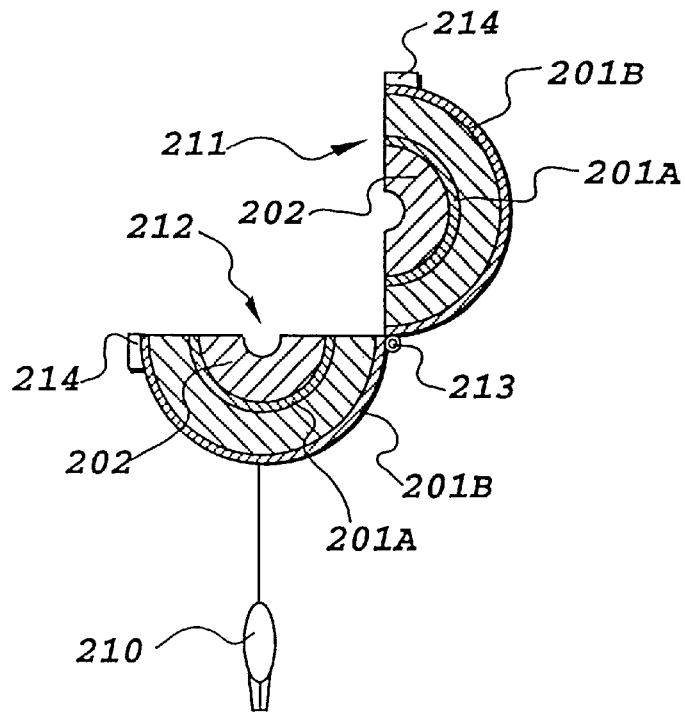
FIGS. 21A and 21B are respectively cross-sectional views taken along line a–a' of FIG. 20B.
Figure 21B:
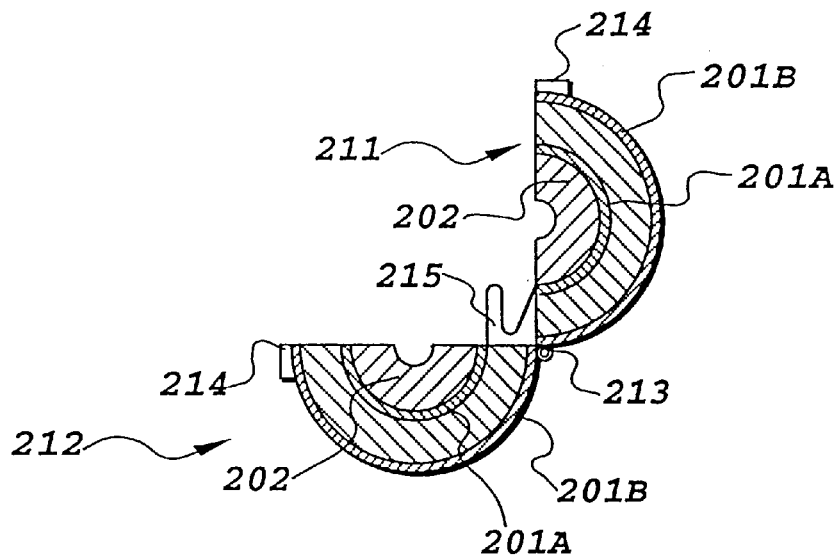

FIGS. 20A and 20B are respectively plane and cross-sectional views schematically showing the configuration of an eighth embodiment of a non-contact voltage probe apparatus according to the present invention. FIGS. 21A and 21B are respectively cross-sectional views taken along line 20 a–a' shown in FIG. 20B. In FIGS. 20A and 20B and FIGS. 21A and 21B, reference numerals 211 and 212 respectively indicate two pairs of semicylindrical electrode half-cut portions obtained by dividing the electrode structure shown in FIG. 18 in half. The electrode structure shown in FIG. 18 is formed by electrically and mechanically joining these half portions 211 and 212 to each other. Reference numeral 202 indicates a fixing jig made of a foamed material, for fixing a cable 220 running into an inner electrode 201A. Reference numeral 213 indicates a fitment for fixing the two semicylindrical electrodes 211 and 212 in the form of a cylinder. Reference numerals 214 indicate fittings (hinges) for mechanically tightening the two semicylindrical electrodes 211 and 212 and electrically connecting them to each other.

The capacitance intended for the coupling of the cylindrical inner electrode 201A and the cable 220 to be measured is calculated from equation (5). In the present embodiment, copper is used as the material for each of the electrodes 201A and 201B. However, a material other than copper may be used if its conductivity is high.

Owing to the use of a material easy to elastically deform, the cable fixing jig 202 can fix the cable 220 to the neighborhood of the center of the cylindrical inner electrode 201A regardless of the diameter of the cable 202 extending into the inner electrode 201A. In the present embodiment, a sponge made of rubber is used as the material for the fixing jig 202. However, other material such as polyurethane or the like may be used if it is a formable material similar to the sponge. Further, a plate spring made of plastic may be used as an alternative to the formable material.

Referring to FIG. 21B, a lead wire or conductor 215 that endures repetitive flexion is provided between the half-divided inner electrodes 201A to ensure electrical connections between the inner electrodes 201A.

Figure 22:
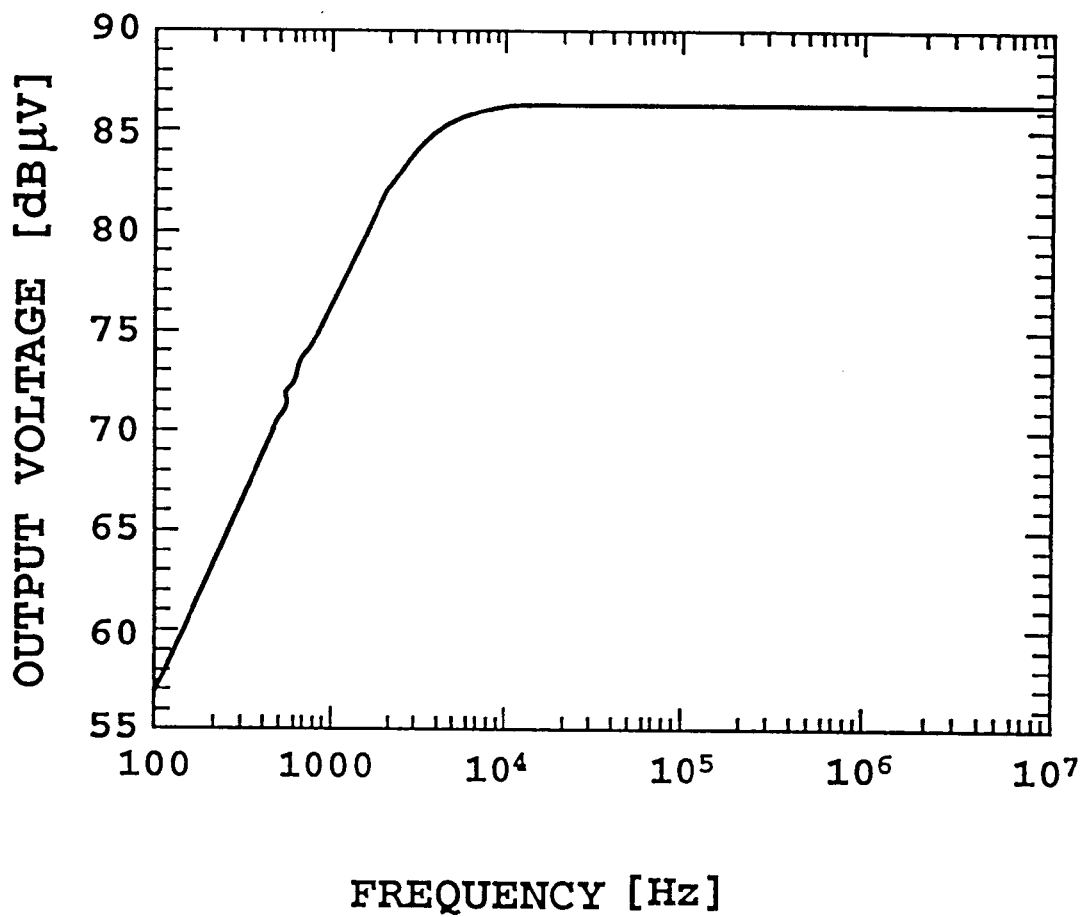
FIG. 22 is a diagram illustrating a frequency response of the eighth embodiment of the present invention.
Figure 23A:
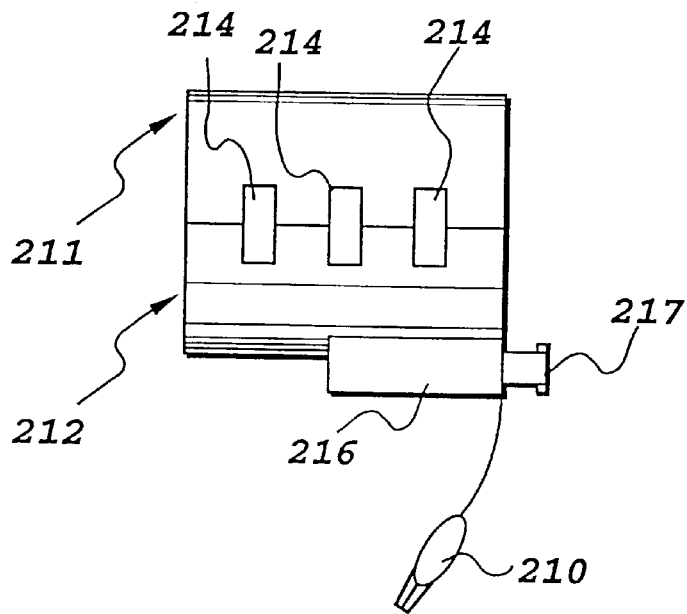
FIGS. 23A and 23B are respectively front and side views showing the configuration of a ninth embodiment of the present invention.
Figure 23B:
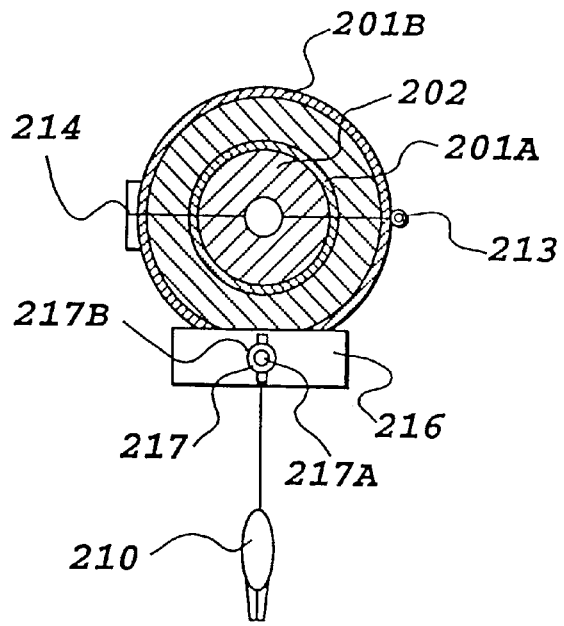

FIG. 22 shows a frequency response of the non-contact voltage probe apparatus illustrative of the eighth embodiment. It is thus possible to confirm the present probe apparatus as a wide-band probe having a frequency response flat on frequencies above 10 kHz.

Ninth Embodiment

A ninth embodiment shows a non-contact voltage probe apparatus wherein a cylindrical outer electrode 201B is provided with a voltage detecting circuit 216 from which a voltage can be transmitted through a coaxial cable or the like terminated with a coaxial connector 217. A central conductor 217A of the coaxial connector 217 is electrically connected to an electrode 201A, and an outer conductor 217B thereof is electrically connected to an electrode 201B. An amplifier may be attached to the voltage detecting circuit 216. The present embodiment can reduce parasitic inductance and capacitance occurring in a ground wire of a high input impedance probe in a high frequency region and hence provide that the probe apparatus has a flat response in a broad frequency range.

Since the cylindrical outer electrode 201B is coaxially provided outside the cylindrical inner electrode 201A, which provides the capacitive coupling to the cable 220, and since the outer electrode 201B is grounded, the sensitivity of the probe 203 can be prevented from varying with a change in the capacitance between the cylindrical inner electrode 201A and a ground metal 230, such as surrounding reinforced bars or the like. If only the cylindrical inner electrode 201A is used when the voltage is developed in a surrounding cable 221 or the like, then the capacitive coupling therebetween, which is due to the voltage in the surrounding cable, influences the measurement of the cable, which is measured with the cylindrical inner electrode 201A. However, this influence can be lessened by using the cylindrical outer electrode 201B.

In order to fix a distance between the inner electrode 201A and the outer electrode 201B at a constant value, a supporting member is disposed therebetween. If the dielectric constant of the material of the supporting member is high, the capacitance between the cylindrical inner electrode 201A and the cylindrical outer electrode 201B is increased, so that the sensitivity of the probe 203 is reduced. Therefore, such a problem can be solved by providing a plastic or foamed material having low dielectric constant as the supporting member between the cylindrical inner electrode 201A and the cylindrical outer electrode 201B, and hence decreasing the capacitance between the electrodes 201A and 201B.

When a movable part is desired, the divided electrode structure in the embodiments shown in FIGS. 20 through 23 is used to easily attach the cable 220 to be measured to the non-contact voltage probe apparatus of the present invention. In this case, it is necessary to electrically and mechanically connect the electrodes to one another in a stable condition. To solve such a problem, the conductor 215, which is excellent in flexibility and endures repetition and flexion, is connected to the movable part to reliably connect both electrodes 201A to one another.

To obtain the same effect as described above, the semicylindrical electrode 211 may be press-fit on the semicylindrical electrode 212 with the hinges 214.

In order to reduce errors produced from the externally-incoming interference and enhance the sensitivity by reducing the capacitance of the probe 203, a high input impedance voltage detecting circuit such as a FET or the like may be attached to the coaxial cylindrical inner electrode as an alternative to the high input impedance voltage probe 203.

According to the seventh, eighth and ninth embodiments, the voltage applied to the cable 220 is detected by the capacitive coupling determined according to the sizes of the cable 220 and the cylindrical inner electrode 201A and the distance therebetween. The sensitivity of the probe apparatus is determined by the ratio of the capacitance for the coupling of the cable 220 and the cylindrical inner electrode 201A, the capacitance between the cylindrical inner electrode 201A and the cylindrical outer electrode 201B, and the input impedance of the voltage probe 203.

According to the seventh, eighth and ninth embodiments, as has been described above, since the cylindrical electrodes are coaxially provided on a double basis, it is possible to eliminate the influence of the voltage developed in the surrounding metal body or the like and stably measure the voltage applied to the cable in good reproducibility. Further, since the voltage is measured under the non-contact state, the voltage developed across the measuring cable conductor can be measured without any damage to the cable and without influencing the service. Accordingly, the present invention is effective in, for example, measuring conducted electromagnetic noise under the operating state.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A non-contact voltage probe apparatus comprising:

a cylindrical inner electrode;

a coaxial cylindrical outer electrode coaxially provided outside said cylindrical inner electrode so as to surround said cylindrical inner electrode;

a cable fixing member disposed inside said cylindrical inner electrode, said cable fixing member for allowing a cable to be measured to penetrate therein and holding the cable therein;

means for detecting voltage having a high input impedance and a ground, said voltage detecting means being attached to said coaxial cylindrical outer electrode, and said voltage detecting means being electrically connected to said cylindrical inner electrode, thereby reducing a measurement error caused by parastitic elements in a high frequency range;

means for connecting said coaxial cylindrical outer electrode to the ground of said voltage detecting means; and a material having a low dielectric constant disposed between said cylindrical inner electrode and said coaxial cylindrical outer electrode.

2. A non-contact voltage probe apparatus as claimed in claim 1, wherein said material is plastic or a foamed material having a low dielectric constant.

3. A non-contact voltage probe apparatus as claimed in claim 1, wherein said inner and outer electrodes and said cable fixing member are made up of two half portions having semi-cylindrical shapes obtained by dividing an integral construction of said inner and outer electrodes and said cable fixing member into two and wherein said two half portions are capable of being electrically and mechanically coupled to each other so as to allow said cable to be interposed inside said cable fixing member.

4. A non-contact voltage probe apparatus as claimed in claim 3, wherein portions of said two half portions, which constitute said cylindrical inner electrode and portions of said two half portions, which constitute said coaxial cylindrical outer electrode, are connected to one another by a repetitive flexion-resistant conductor.

5. A non-contact voltage probe apparatus as claimed in claim 3, wherein said two half portions are electrically and mechanically coupled to each other with hinges or electrical contacts.

6. A non-contact voltage probe apparatus as claimed in claim 1, wherein said voltage detecting means is a high input impedance voltage probe having active elements.

* * * * *